(12) United States Patent
Kuang

(10) Patent No.: US 8,134,374 B2
(45) Date of Patent: Mar. 13, 2012

(54) EVALUATION CIRCUIT FOR CAPACITANCE AND METHOD THEREOF

(75) Inventor: Yu Kuang, Hsinchu (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 409 days.

(21) Appl. No.: 12/494,477

(22) Filed: Jun. 30, 2009

(65) Prior Publication Data

US 2010/0013502 A1 Jan. 21, 2010

(30) Foreign Application Priority Data

Jul. 18, 2008 (TW) .................................. 97127517 A

(51) Int. Cl.
*G01R 27/26* (2006.01)
(52) U.S. Cl. ......... 324/658; 324/686; 324/678; 324/679
(58) Field of Classification Search .................. None
See application file for complete search history.

(56) References Cited

U.S. PATENT DOCUMENTS

| 5,659,254 A * | 8/1997 | Matsumoto et al. .......... 324/678 |
| 7,288,946 B2 * | 10/2007 | Hargreaves et al. .......... 324/678 |
| 7,782,068 B2 * | 8/2010 | Kuang .......................... 324/658 |

* cited by examiner

*Primary Examiner* — Vinh Nguyen

(57) ABSTRACT

In an evaluation method, voltages at ends of a to-be-measured capacitor and a capacitance-adjustable circuit are switched in response to a first set of clock signals so as to adjust an integrated voltage to be a sum of the integrated voltage and a first difference voltage. Next, whether a first control event is received is judged. If not, the previous step is performed. If yes, an integration operation is performed to switch a voltage of an end of a known capacitor in order to adjust the integrated voltage to be a sum of the integrated voltage and a second difference voltage. Next, whether an integrating period ends is judged. If not, the first step is repeated. If yes, a capacitance of the to-be-measured capacitor is obtained according to the number of times that the integration operation is performed in the integrating period and a capacitance of the known capacitor.

7 Claims, 15 Drawing Sheets

US 8,134,374 B2

EVALUATION CIRCUIT FOR CAPACITANCE AND METHOD THEREOF

This application claims the benefit of Taiwan application Serial No. 97127517, filed Jul. 18, 2008, the subject matter of which is incorporated herein by reference.

BACKGROUND OF THE INVENTION

1. Field of the Invention

The invention relates in general to a capacitance evaluation circuit, and more particularly to a capacitance evaluation circuit for obtaining a capacitance of a to-be-measured capacitor by observing response times of charge and discharge when charge and discharge operations are performed according to a capacitance difference between the to-be-measured capacitor and a capacitance adjustable circuit.

2. Description of the Related Art

Conventionally, a mechanical switch is frequently provided to implement a user control interface device. Because the conventional mechanical switch needs to be in direct contact with the user so as to operate in response to the user's control command, the conventional mechanical device tends to have the structure damage during the user's operation process.

In the modern age, in which the technology changes with each passing day, a touch switch has been available. Conventionally, the touch switch, such as a capacitive switch, performs the control by sensing the variation of the capacitance of the to-be-measured capacitor with the approach of the user or not. However, how to design a capacitance evaluation circuit capable of effectively detecting the variation of the capacitance of the to-be-measured capacitor to enhance the capacitive switch has become an important direction to be developed in the industry.

SUMMARY OF THE INVENTION

The invention is directed to a capacitance evaluation circuit, which may evaluate a capacitance of a to-be-measured capacitor more precisely than the conventional capacitance evaluation circuit.

According to a first aspect of the present invention, a capacitance evaluation circuit including an integrator circuit, a first control circuit, a second control circuit and a processor circuit. The integrator circuit has a first input terminal and a first output terminal, which has an integrated voltage. The integrator circuit is for setting the integrated voltage to be an initial level in response to an enable level of a first control signal. The first control circuit includes a second output terminal, a to-be-measured capacitor and a capacitance-adjustable circuit. The second output terminal is electrically connected to the first input terminal. The capacitance-adjustable circuit determines an equivalent capacitance approaching a capacitance of the to-be-measured capacitor in response to a signal value of a setting signal. The first control circuit switches voltage levels of at least one end of the to-be-measured capacitor and at least one end of the capacitance-adjustable circuit in response to a first set of clock signals, and thus performs a first adjusting operation to adjust the integrated voltage to be a sum of a present level of the integrated voltage and a first difference voltage. The first difference voltage is relevant to a difference between the capacitance of the to-be-measured capacitor and the equivalent capacitance. The second control circuit includes a third output terminal and a known capacitor. The third output terminal is electrically connected to the first input terminal. The second control circuit is for switching a voltage level of at least one end of the known capacitor in response to a second set of clock signals to perform a second adjusting operation to adjust the integrated voltage to be a sum of the present level of the integrated voltage and a second difference voltage. The processor circuit is for providing the first and second sets of clock signals to drive the first and second control circuits to perform the first and second adjusting operations, respectively, for calculating the number of operation times that the second control circuit performs the second adjusting operation in a first integrating period, and for obtaining the capacitance of the to-be-measured capacitor according to the number of operation times and a capacitance of the known capacitor.

According to a second aspect of the present invention, a capacitance evaluation method is provided. The method includes the steps of: (a) switching voltages of at least one end of a to-be-measured capacitor and at least one end of a capacitance-adjustable circuit in response to a first set of clock signals to perform a first adjusting operation to adjust an integrated voltage of one end of an integration capacitor to be a sum of a present level of the integrated voltage and a first difference voltage, which is relevant to a difference between a capacitance of the to-be-measured capacitor and an equivalent capacitance of the capacitance-adjustable circuit; (b) repeating the step (a) N times or N time to adjust the integrated voltage from a first level to a second level, wherein N is a natural number; (c) switching a voltage of at least one end of a known capacitor in response to a second set of clock signals to perform a second adjusting operation to adjust the integrated voltage to be a sum of the present level of the integrated voltage and a second difference voltage; (d) judging whether a first control event is received, and repeating the step (c) if not, or performing step (e) if yes; and (e) determining an integrating period, calculating the number M of clock cycles of the second set of clock signals in the integrating period, and obtaining the capacitance of the to-be-measured capacitor according to the values M and N and a capacitance of the known capacitor.

According to a third aspect of the present invention, a capacitance evaluation method is provided. The method includes the steps of: (a) switching a voltage of at least one end of a known capacitor in response to a first set of clock signals to perform a first adjusting operation to adjust an integrated voltage of one end of an integration capacitor to be a sum of a present level of the integrated voltage and a first difference voltage; (b) repeating the step (a) N times or N time to adjust the integrated voltage from a first level to a second level, wherein N is a natural number; (c) switching voltages of at least one end of a to-be-measured capacitor and at least one end of a capacitance-adjustable circuit in response to a second set of clock signals to perform a second adjusting operation to adjust the integrated voltage to be a sum of the present level of the integrated voltage and a second difference voltage, which is relevant to a capacitance of the to-be-measured capacitor and an equivalent capacitance of the capacitance-adjustable circuit; (d) judging whether a first control event is received, and repeating the step (c) if not or performing step (e) if yes; and (e) determining an integrating period, calculating the number M of clock cycles of the second set of clock signals in the integrating period, and obtaining the capacitance of the to-be-measured capacitor according to the values M and N and a capacitance of the known capacitor.

According to a fourth aspect of the present invention, a capacitance evaluation method for measuring a capacitance of a to-be-measured capacitor in an integrating period is provided. The capacitance evaluation method comprising the steps of: (a) switching voltages of at least one end of the to-be-measured capacitor and at least one end of a capacitance-adjustable circuit in response to a first set of clock signals to perform a first adjusting operation to adjust an integrated voltage stored on one end of an integration capacitor to be a sum of a present level of the integrated voltage and a first difference voltage, which is relevant to a difference between the capacitance of the to-be-measured capacitor and an equivalent capacitance of the capacitance-adjustable circuit; (b) judging whether a first control event is received; (c) adding 1 to a count value when the first control event is received; (d) switching a voltage of at least one end of a known capacitor in one operating period to perform a second adjusting operation to adjust the integrated voltage to be a sum of the present level of the integrated voltage and a second difference voltage, which is relevant to a capacitance of the known capacitor; (e) judging whether the integrating period ends; and (f) obtaining the number of operation times that the second adjusting operation is performed in the integrating period according to the count value when the integrating period ends, and obtaining the capacitance of the to-be-measured capacitor according to the number of operation times and the capacitance of the known capacitor.

The invention will become apparent from the following detailed description of the preferred but non-limiting embodiments. The following description is made with reference to the accompanying drawings.

DETAILED DESCRIPTION OF THE INVENTION

The capacitance evaluation circuit of this embodiment is to perform an integration operation on voltages of a node through a to-be-measured capacitor, a capacitance-adjustable circuit and a known capacitor, and to obtain a capacitance of the to-be-measured capacitor according to a ratio of an operation time of a charge operation to an operation time of a discharge operation, and a capacitance of the known capacitor.

First Embodiment

Figure 1:
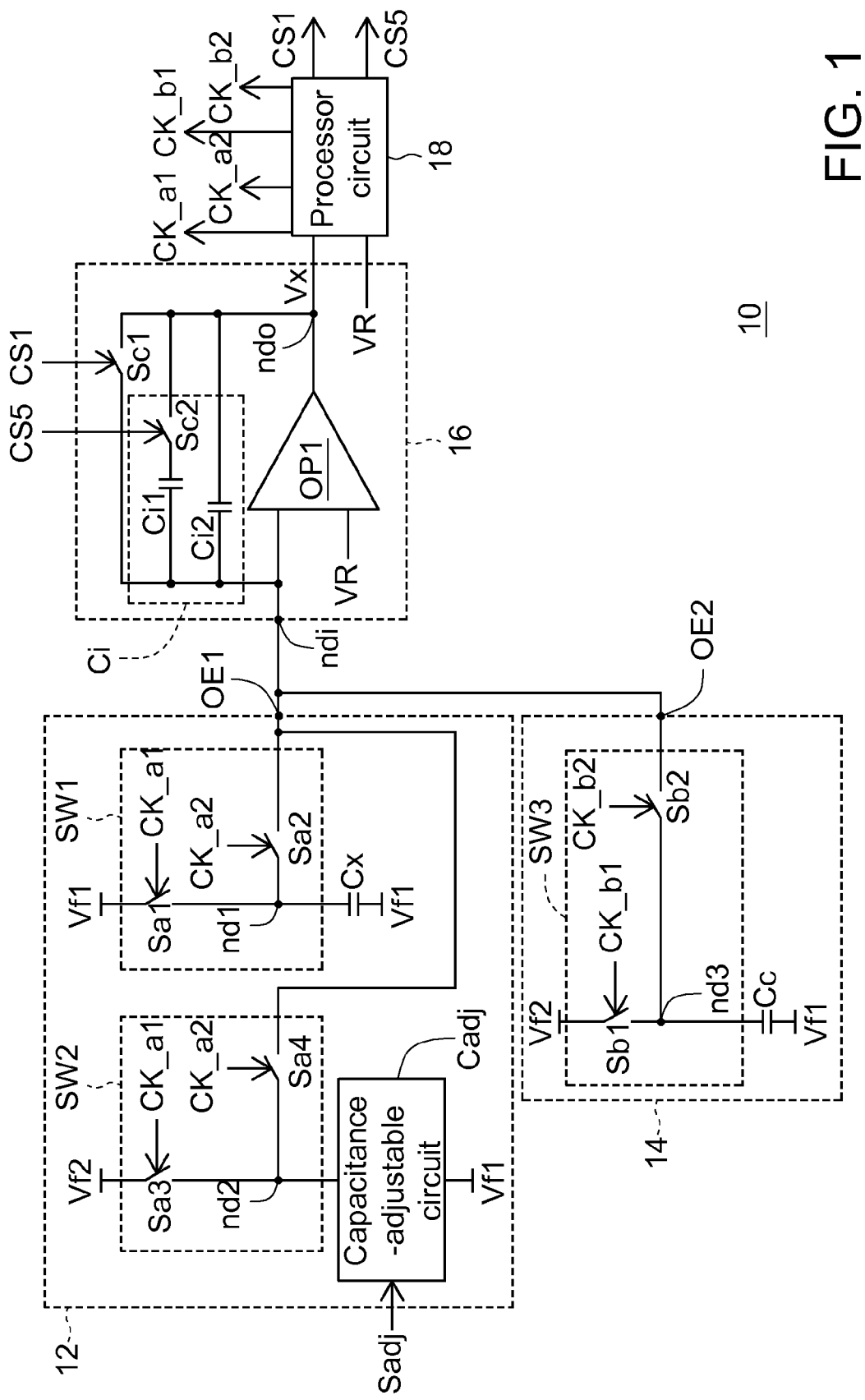
FIG. 1 is a block diagram showing a capacitance evaluation circuit according to a first embodiment of the invention.

The capacitance evaluation circuit of this embodiment is to perform a dual-slope algorithm calculation to obtain a capacitance variation of a to-be-measured capacitor. FIG. 1 is a block diagram showing a capacitance evaluation circuit 10 according to a first embodiment of the invention. Referring to FIG. 1, the capacitance evaluation circuit 10 includes control circuits 12 and 14, an integrator circuit 16 and a processor circuit 18. The control circuits 12 and 14 respectively control the integrator circuit 16 to set an integrated voltage Vx from an initial level to an end level, and from the end level to the initial level. For example, the initial level is equal to a reference voltage VR, and the end level is higher than the initial level. The processor circuit 18 generates corresponding signals to drive the control circuits 12 and 14 and the integrator circuit 16 to perform the above-mentioned operations, and calculates a capacitance of a to-be-measured capacitor Cx in response to a level variation of the integrated voltage Vx. Next, the operation of each element of the capacitance evaluation circuit 10 will be described in the following.

The integrator circuit 16 includes an input terminal ndi, an output terminal ndo, a switch Sc1, an integration capacitor Ci and an operational amplifier OP1, wherein the voltage of the output terminal ndo is the integrated voltage Vx. The integration capacitor Ci includes capacitors Ci1 and Ci2 and a switch Sc2. The switch Sc2 is turned on in response to an enabled control signal CS5 so that the capacitance of the integration capacitor Ci is substantially equal to a sum of capacitances of the capacitors Ci1 and Ci2. Two ends of the switch Sc1 and two ends of the integration capacitor Ci are respectively connected to the negative input terminal and the output terminal ndo of the operational amplifier OP1. The switch Sc1 is turned on by an enabled control signal CS1. The positive input terminal of the operational amplifier OP1 receives the reference voltage VR. The reference voltage VR is a specific reference voltage ranging between the highest voltage VDD of the capacitance evaluation circuit 10 and the ground voltage in this embodiment. For example, the reference voltage VR is substantially equal to a voltage VDD/2.

The control circuit 12 includes an output terminal OE1, switch circuits SW1 and SW2, the to-be-measured capacitor Cx and a capacitance-adjustable circuit Cadj. The switch circuit SW1 includes switches Sa1 and Sa2. First ends of the switches Sa1 and Sa2 are coupled to a node nd1, and second ends of the switches Sa1 and Sa2 are for receiving a voltage Vf1 and being coupled to the negative input terminal of the operational amplifier OP1, respectively. The switches Sa1 and Sa2 are respectively turned on by enabled clock signals CK_a1 and CK_a2. Two ends of the to-be-measured capacitor Cx are for being coupled to the node nd1 and receiving the voltage Vf1, respectively. The voltage Vf1 is, for example, the ground voltage.

The switch circuit SW2 includes switches Sa3 and Sa4. First ends of the switches Sa3 and Sa4 are coupled to a node nd2, and second ends of the switches Sa3 and Sa4 are for receiving a voltage Vf2 and being coupled to the negative input terminal of the operational amplifier OP1, respectively. The voltage Vf2 is, for example, the highest voltage VDD. The switches Sa3 and Sa4 are respectively turned on by the enabled clock signals CK_a1 and CK_a2. Two ends of the capacitance-adjustable circuit Cadj are for being coupled to the node nd2 and receiving the voltage Vf1, respectively. The capacitance-adjustable circuit Cadj determines an equivalent capacitance in response to a signal value of a setting signal Sadj provided by the processor circuit 18. In this embodiment, the processor circuit 18 provides the corresponding setting signal Sadj to set the equivalent capacitance of the capacitance-adjustable circuit Cadj to be substantially equal to the capacitance of the to-be-measured capacitor Cx.

The control circuit 14 includes an output terminal OE2, a switch circuit SW3 and a known capacitor Cc coupled to a node nd3. The switch circuit SW3 includes switches Sb1 and Sb2, which have first ends coupled to the node nd3 and second ends for receiving the voltage Vf2 and being coupled to the negative input terminal of the operational amplifier OP1, respectively. The switches Sb1 and Sb2 are respectively turned on by enabled clock signals CK_b1 and CK_b2. Two ends of the known capacitor Cc are for being coupled to the node nd3 and receiving the voltage Vf1, respectively.

Figure 2:
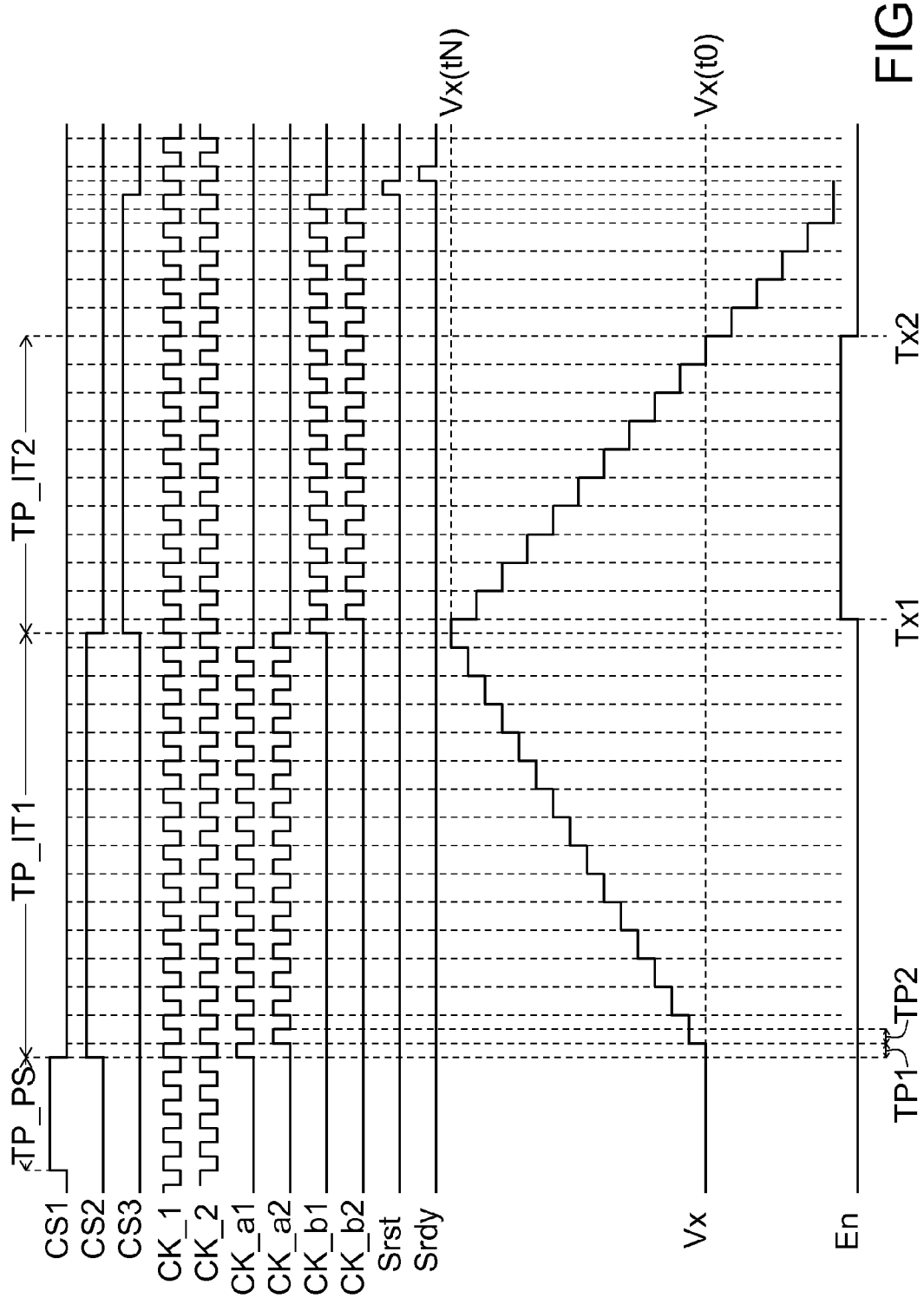
FIG. 2 is a timing chart showing relevant signals of the capacitance evaluation circuit 10 of FIG. 1.

FIG. 2 is a timing chart showing relevant signals of the capacitance evaluation circuit 10 of FIG. 1. Referring to FIG. 2, the capacitance evaluation circuit 10 of this embodiment includes, for example, a voltage setting period TP_PS, and integrating periods TP_IT1 and TP_IT2. In one example, the control signal CS5 is enabled in the setting period TP_PS and the integrating periods TP_IT1 and TP_IT2 such that the capacitance of the integration capacitor Ci is substantially equal to a sum of the capacitances of the capacitors Ci1 and Ci2.

In the voltage setting period TP_PS, the processor circuit 18 enables the control signal CS1 to turn on the switch Sc1. Thus, the operational amplifier OP1 is substantially biased to become a unit gain buffer, and the voltage of the positive and negative input terminals and the output terminal ndo of the operational amplifier OP1 (i.e., the integrated voltage Vx) is set to be the reference voltage VR.

In the integrating period TP_IT1, the processor circuit 18 provides the clock signals CK_a1 and CK_a2 to correspondingly turn on the switches Sa1 to Sa4. For example, the clock signals CK_a1 and CK_a2 respectively have high levels in the first and second sub-operating periods, and respectively have low levels in the second and first sub-operating periods, wherein the first and second sub-operating periods are respectively equal to a positive half cycle and a negative half cycle of the clock signal CK_a1. When one cycle of the clock signal CK_a1 is elapsed, the integrator circuit 16 completes the integration operation on the integrated voltage Vx.

More specifically, in first sub-operating period TP1, the switches Sa1 and Sa3 are turned on while the switches Sa2 and Sa4 are turned off, the crossover voltage between two ends of each of the to-be-measured capacitor Cx and the integration capacitor Ci is equal to 0 volts (V), and the crossover voltage between the two ends of the capacitance-adjustable circuit Cadj are equal to Vf2-Vf1 volts, such as the highest voltage VDD. In second sub-operating period TP2, the switches Sa1 and Sa3 are turned off while the switches Sa2 and Sa4 are turned on. Because the node ndi (i.e., the negative input terminal of the operational amplifier OP1) coupled to the to-be-measured capacitor Cx, the capacitance-adjustable circuit Cadj and the integration capacitor Ci is floating in the second sub-operating period TP2, the total charges stored in the to-be-measured capacitor Cx, the capacitance-adjustable circuit Cadj and the integration capacitor Ci in the first sub-operating period TP1 are substantially equal to the total charges stored therein in the second sub-operating period TP2. That is, the following equation is satisfied:

$$Cx \times (Vf1-Vf1) + Cadj \times (Vf2-Vf1) + Ci \times [VR-Vx(t0)] \\ = Cx \times (VR-Vf) + Cadj \times (VR-Vf) + Ci \times [VR-Vx(t1)] \quad (1)$$

wherein the left section of Equation (1) represents the total charges stored in the to-be-measured capacitor Cx, the capacitance-adjustable circuit Cadj and the integration capacitor Ci in the first sub-operating period TP1, and the right section represents the total charges stored in the to-be-measured capacitor Cx, the capacitance-adjustable circuit Cadj and the integration capacitor Ci in the second sub-operating period TP2. The voltage level Vx(t0) is the initial level of the integrated voltage Vx, which is substantially equal to the reference voltage VR. If the reference voltage VR is equal to the average voltage of the voltage Vf1 and the voltage Vf2, the following equations may be further derived according to Equation (1):

$$Vx(t1) = \frac{1}{Ci} \times \left[ \frac{(Vf2-Vf1)}{2} \times (Cx-Cadj) + \frac{Vf2+Vf1}{2} \times Ci \right] \quad (2)$$

$$\Delta V1 = Vx(t1) - Vx(t0) \quad (3)$$

$$= \frac{1}{Ci} \times$$

$$\left[ \frac{(Vf2-Vf1)}{2} \times (Cx-Cadj) + \frac{Vf2+Vf1}{2} \times Ci \right] - VR$$

$$= \frac{(Cx-Cadj) \times (Vf2-Vf1)}{2 \times Ci}$$

According to the above-mentioned derivation, the integrated voltage Vx is substantially increased by a difference voltage ΔV1 after one integration operation is performed. For example, the integrating period TP_IT1 includes N cycles of the clock signal CK_a1, and the control circuit 12 and the integrator circuit 16 repeat, N time(s), the integration operation similar to that mentioned hereinabove to increase the level of the integrated voltage Vx from its initial level (=reference voltage VR) to the end level Vx(tN), N is a natural number, and the end level Vx(tN) satisfies:

$$Vx(tN) = N \times \left[ \frac{(Cx-Cadj) \times (Vf2-Vf1)}{2 \times Ci} \right] + VR \quad (4)$$

In the integrating period TP_IT2, the processor circuit 18 provides the clock signals CK_b1 and CK_b2 to drive the control circuit 14 to perform the operations similar to those performed by the control circuit 12 so as to integrate the integrated voltage Vx. The difference voltage ΔV2 satisfies:

$$\Delta V2 = \frac{Cc \times (Vf1-Vf2)}{2 \times Ci} \quad (5)$$

According to the derivation, it is obtained that the integrated voltage Vx is lowered by a difference voltage ΔV2 in one integration operation. The integrating period TP_IT2 of this embodiment includes, for example M cycles of the clock signal CK_b1. In each cycle of the clock signal CK_b1, the control circuit 14 and the integrator circuit 16 perform the similar integration operations, wherein M is a natural number. Thus, the level of the integrated voltage Vx is lowered from its end level Vx(tN) to the initial level VR by repeating the integration operation M times. That is, the following equation is satisfied:

$$VR = Vx(tN) + M \times \Delta V2 \quad (6)$$

$$= N \times \left[ \frac{(Cx - Cadj) \times (Vf2 - Vf1)}{2 \times Ci} \right] +$$

$$VR + M \times \left[ \frac{Cc \times (Vf1 - Vf2)}{2 \times Ci} \right]$$

By arranging Equation (6), the relationships between the to-be-measured capacitor Cx, the equivalent capacitance of the capacitance-adjustable circuit Cadj, can be obtained, wherein the values M and N and the known capacitor Cc are as follows:

$$Cx - Cadj = \frac{M}{N} \times Cc \quad (7)$$

Thus, the processor circuit 18 further obtains the capacitance of the to-be-measured capacitor Cx according to the above-mentioned equation, the values M and N, and the capacitances of the known capacitor Cc and the capacitance-adjustable circuit Cadj.

Figure 3:
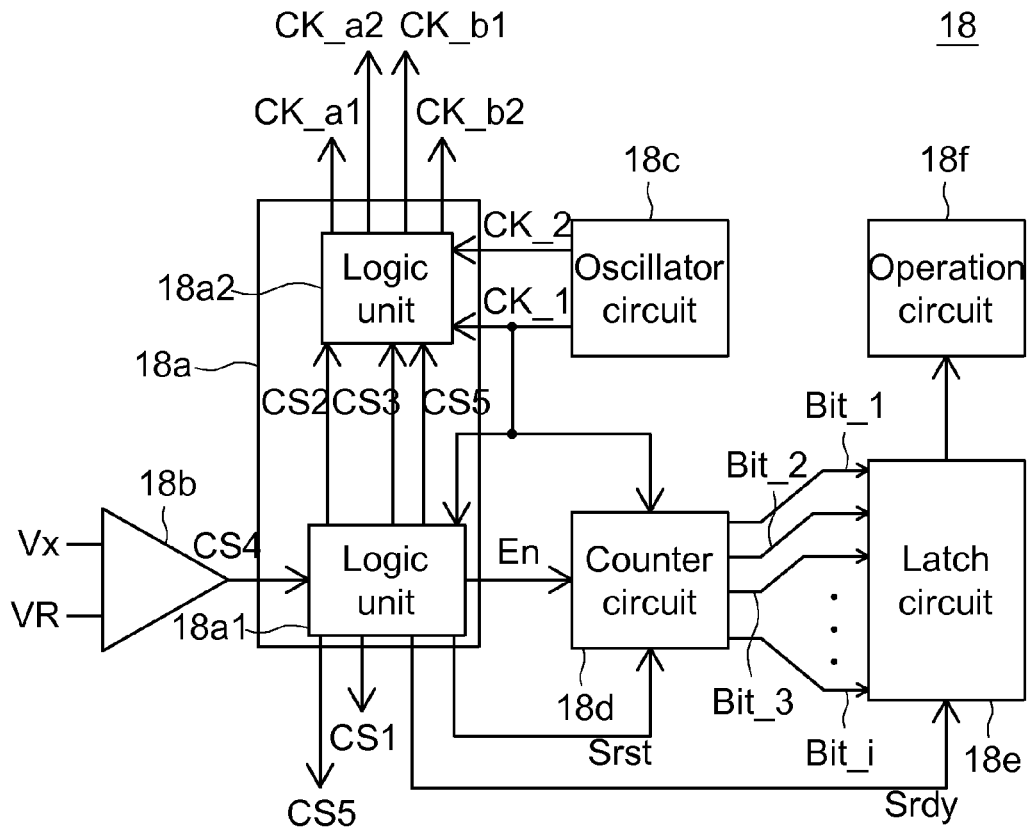
FIG. 3 is a detailed block diagram showing the processor circuit 18 of FIG. 1.

FIG. 3 is a detailed block diagram showing the processor circuit 18 of FIG. 1. In detailed, the processor circuit 18 includes a logic circuit 18a, a comparator circuit 18b, an oscillator circuit 18c, a counter circuit 18d, a latch circuit 18e and an operation circuit 18f. The logic circuit 18a includes logic units 18a1 and 18a2. The logic unit 18a2 generates the clock signals CK_a1 and CK_a2 in response to an enabled control signal CS2 and generates the clock signals CK_b1 and CK_b2 in response to an enabled control signal CS3.

Figure 4:
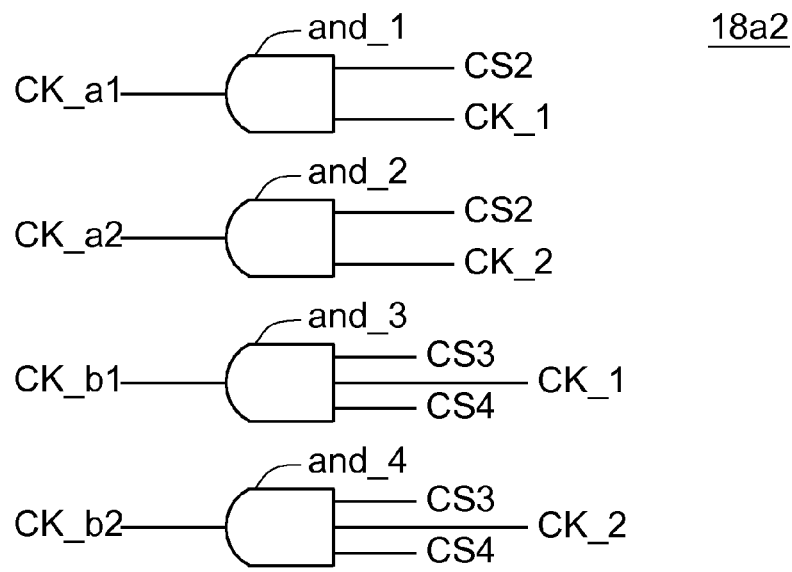
FIG. 4 is a detailed block diagram showing the logic unit 18a2 of FIG. 3.

FIG. 4 is a detailed block diagram showing the logic unit 18a2 of FIG. 3. For example, logic gates and_1 and and_3 respectively generate the clock signals CK_a1 and CK_b1 according to the clock signal CK_1 generated by the oscillator circuit 18c, and logic gates and_2 and and_4 respectively generate the clock signals CK_a2 and CK_b2 according to the clock signal CK_2 generated by the oscillator circuit 18c.

The logic unit 18a1 generates the control signal CS1 in the voltage setting period TP_PS to control the integrator circuit 16 to set the charge voltage Vx to be the reference voltage VR. The logic unit 18a1 generates the enabled control signals CS2 and CS3 in the integrating periods TP_IT1 and TP_IT2, respectively, to control the logic unit 18a2 to generate the clock signals CK_a1 and CK_a2 and the clock signals CK_b1 and CK_b2. The logic unit 18a1 further records the number of cycle times of the clock signal CK_1 in the integrating period TP_IT2.

In this embodiment, the logic unit 18a1 determines the control signal CS3 and starts to generate the enabled control signal CS3 from a starting time instant Tx1 of the integrating period TP_IT2. The logic unit 18a1 further detects whether a control event is triggered and determines an ending time instant Tx2 of the integrating period TP_IT2 in response to the control event.

For example, the control event is the event that a control signal CS4 generated by the comparator circuit 18b is enabled. The comparator circuit 18b receives and compares the levels of the integrated voltage Vx and the reference voltage VR with each other, and correspondingly generates the control signal CS4. When the integrated voltage Vx is higher than the reference voltage VR, the control signal CS4 is disabled. When the level of the integrated voltage Vx is substantially lower than the reference voltage VR, the comparator circuit 18b enables the control signal CS4. Thus, the logic unit 18a1 can effectively determine the ending time instant Tx2 of the integrating period TP_IT2 in response to the control event triggered by the comparator circuit 18b.

For example, the logic unit 18a1 enables a driving signal En in a period between the time instants Tx1 and Tx2 to drive the counter circuit 18d to perform a counting operation of adding 1 to the count value every second cycle time of the clock signal CK_1 (equal to the cycle of the clock signal CK_b1). Thus, the processor circuit 18 of this embodiment can obtain the value M through the counting operation of the counter circuit 18d.

The counter circuit 18d is, for example, an i-bit counter circuit for counting to generate and output i sets of bit data Bit_1 to Bit_i with the value M to the latch circuit 18e. The latch circuit 18e receives and records the latch data, which includes the bit data Bit_1 to Bit_i. The operating unit 18f obtains the value M according to the bit data Bit_1 to Bit_i stored in the latch circuit 18e, and obtains the capacitance of the to-be-measured capacitor Cx according to the relationships between the to-be-measured capacitor Cx, the values M and N, the equivalent capacitance of the capacitance-adjustable circuit Cadj and the known capacitor Cc.

The logic unit 18a1 further sequentially generates a latch signal Srdy and a reset signal Srst after the integrating period TP_IT2. Thus, the latch circuit 18e latches the output value of the counter circuit 18d in response to the latch signal Srdy. After the latch circuit 18e finishes the operation of latching the output value, the counter circuit 18d resets its count value in response to the reset signal Srst. After the latch circuit 18e and the counter circuit 18d finish the latching operation and the resetting operation, the processor circuit 18 may perform the next measurement operation of measuring the capacitance of the to-be-measured capacitor.

The logic unit 18a1 of this embodiment further records the value N, and determines the number of cycles of the clock signal CK_1 in the integrating period TP_IT1 according to the value N. In this embodiment, the value N (i.e., the number of cycles of the clock signal CK_a1 in the integrating period TP_IT1) is adjustable. The user can make the capacitance evaluation circuit 10 of this embodiment be adapted to the measurement of to-be-measured capacitors Cx with different ranges of capacitances by adjusting the value N.

Figure 5:
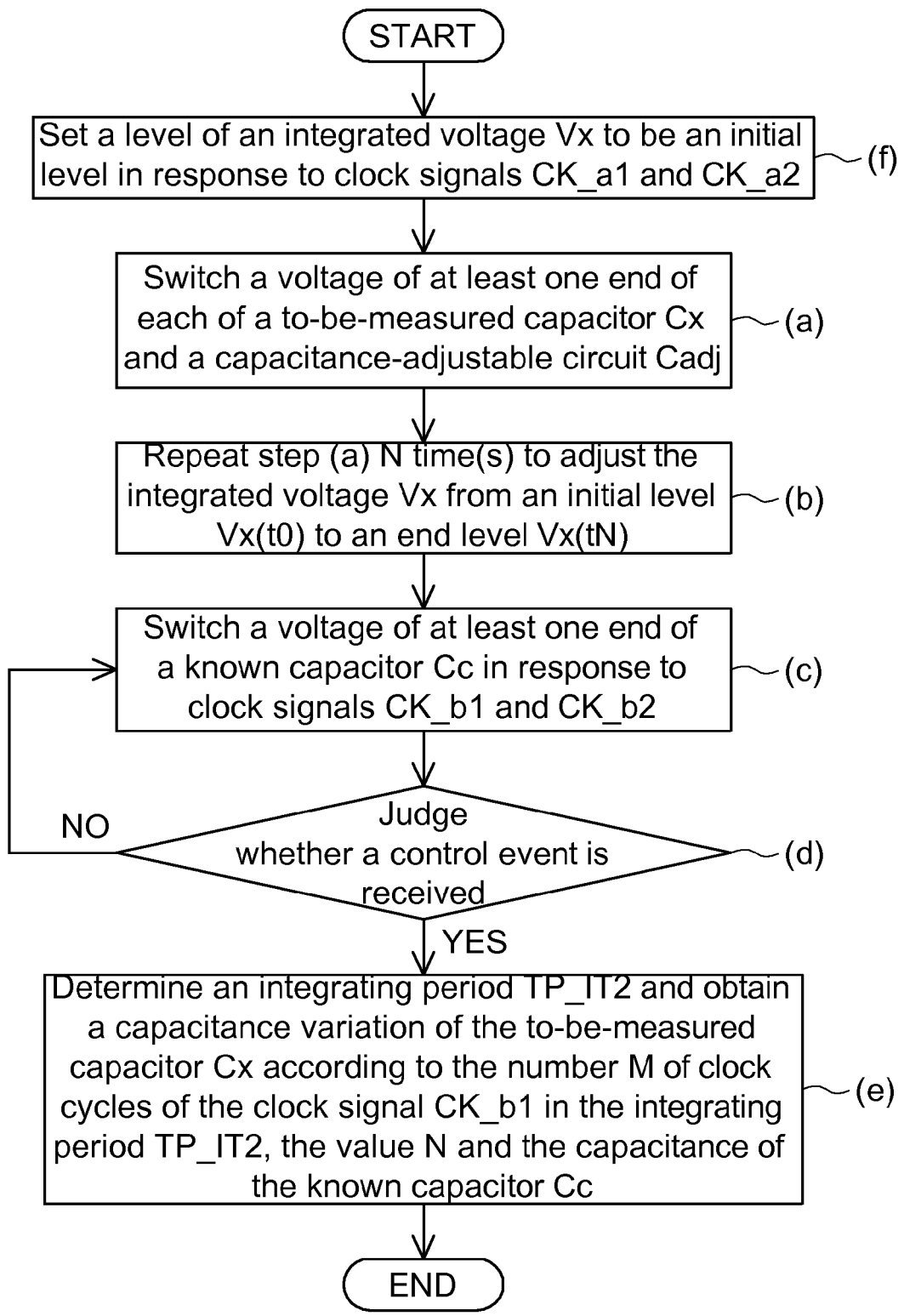
FIG. 5 is a flow chart showing a capacitance evaluation method according to the first embodiment of the invention.

FIG. 5 is a flow chart showing a capacitance evaluation method according to the first embodiment of the invention. First, as shown in step (a), the control circuit 12 switches the voltages of at least one end of the to-be-measured capacitor Cx and at least one end of the capacitance-adjustable circuit Cadj in response to the clock signals CK_a1 and CK_a2 to adjust the integrated voltage Vx to be a sum of a present level of the integrated voltage Vx and a difference voltage ΔV1. Next, as shown in step (b), the control circuit 12 repeats the step (a) N times in response to the clock signals CK_a1 and CK_a2 to adjust the integrated voltage Vx from the initial level Vx(t0) to be the end level Vx(tN).

Then, as shown in step (c), the control circuit 14 switches the voltage of at least one end of the known capacitor Cc in response to the clock signals CK_b1 and CK_b2 to adjust the integrated voltage Vx to be a sum of the present level of the integrated voltage Vx and a difference voltage ΔV2. Next, as shown in step (d), the logic unit 18a1 of the processor circuit 18 judges whether the control event is received. If not, the step (c) is repeated. If yes, step (e) is performed. For example, the control event is the event that the control signal CS4 is enabled.

Then, as shown in the step (e), the processor circuit 18 determines the integrating period TP_IT2, and counts the number M of clock cycles of the clock signal CK_b1 in the integrating period TP_IT2. The processor circuit 18 also obtains the capacitance variation of the to-be-measured capacitor Cx according to the values M and N, the equivalent capacitance of the capacitance-adjustable circuit Cadj and the capacitance of the known capacitor Cc.

In one example, the method further includes, before the step (a), the step (f), in which the processor circuit 18 generates the control signal CS1 to turn on the switch Sc1 and thus to set the level of the integrated voltage Vx to be the initial level (i.e., the level of the reference voltage VR).

In this embodiment, the illustrated capacitance evaluation circuit 10 has the circuit structure of FIG. 1. However, the capacitance evaluation circuit 10 of this embodiment is not restricted to the circuit structure of FIG. 1. In another example, the capacitance evaluation circuit of this embodiment may have the structure shown in FIG. 6.

The difference between the capacitance evaluation circuits 20 and 10 is that a switch circuit SW2' in a control circuit 22 includes switches Sa31, Sa32, Sa41 and Sa42, and a switch circuit SW3' of a control circuit 24 includes switches Sb11, Sb12, Sb21 and Sb22. According to the associated descriptions of the capacitance evaluation circuit 10, if the reference voltage Vf2' is equal to the voltage Vf2', the similar equations may be obtained:

$$Cx \times (Vf1 - Vf1) + Cadj \times (Vf2' - Vf1) + Ci \times (Vf2' - Vf2') = \quad (8)$$
$$Cx \times (Vf2' - Vf1) + Cadj \times (Vf2' - Vf2') + Ci \times (Vf2' - Vx(t1))$$

$$\Delta V1 = Vx(t1) - Vf2' \quad (9)$$
$$= \frac{1}{Ci} \times [Cx \times (Vf2' - Vf1) + Cadj \times (Vf1 - Vf2')]$$
$$= \frac{(Cx - Cadj) \times (Vf2' - Vf1)}{Ci}$$

$$\Delta V2 = \frac{Cc \times (Vf1 - Vf2')}{Ci} \quad (10)$$

$$Vf2' = Vf2' + N \times \Delta V1 + M \times \Delta V2 \Rightarrow Cx - Cadj = \frac{M}{N} \times Cc \quad (11)$$

Thus, similar to the capacitance evaluation circuit 10, the capacitance evaluation circuit 20 may also measure the capacitance of the to-be-measured capacitor Cx through the similar integration operation. The voltage Vf2' satisfies the condition:

$$Vf2' + N \times \Delta V1 \leq VDD \quad (12)$$

Thus, it is possible to prevent the operation of integrating the integrated voltage Vx to the highest voltage VDD before N times of integration operations on the integrated voltage Vx are finished.

Figure 6:
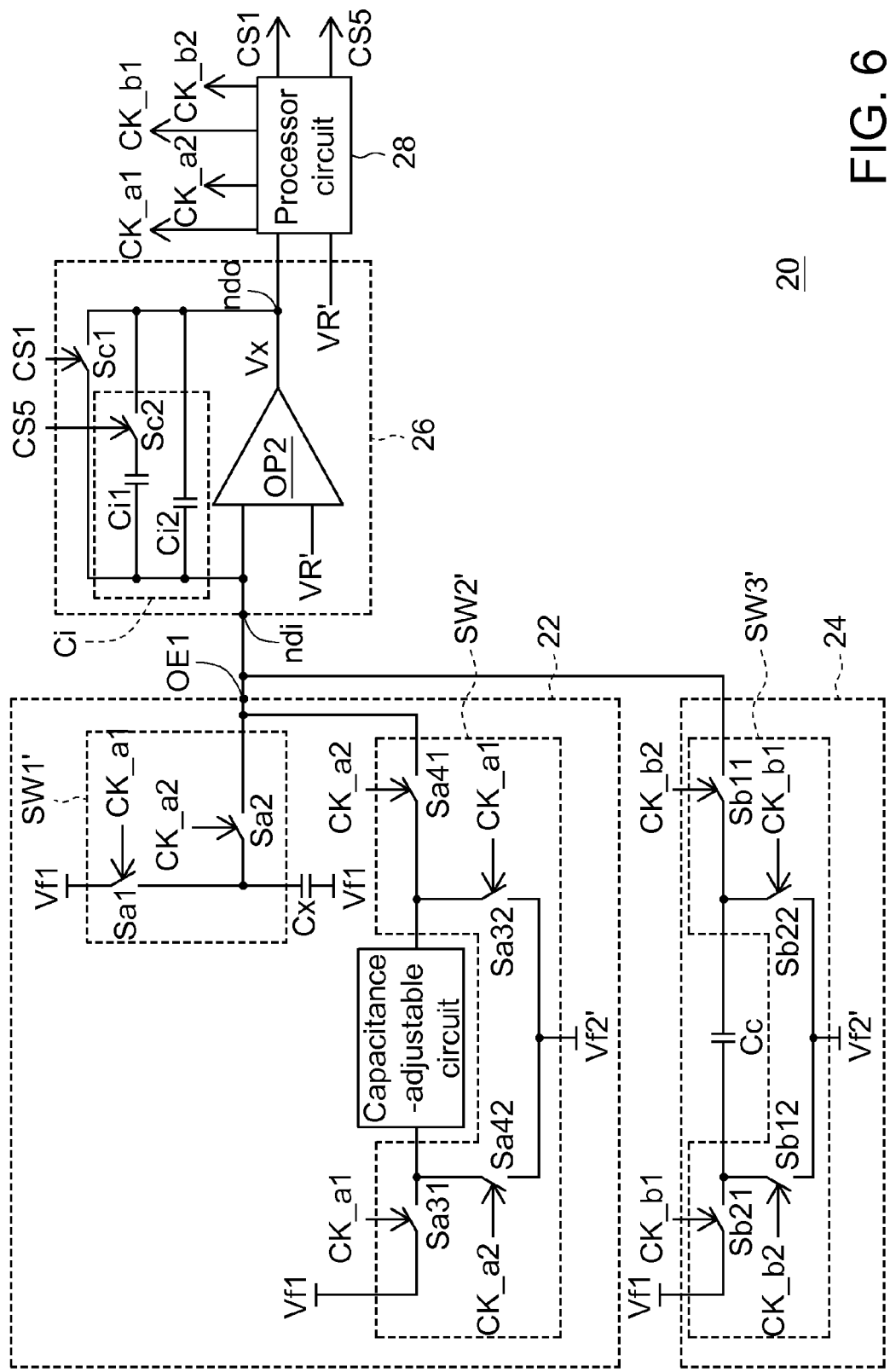
FIG. 6 is another block diagram showing the capacitance evaluation circuit according to the first embodiment of the invention.

In the example of FIG. 6, one end of the to-be-measured capacitor Cx receives the voltage Vf1. However, the one end of the to-be-measured capacitor Cx is not restricted to have only the function of receiving the voltage Vf1, and may further have the function of receiving a voltage ranging between the highest voltage VDD and the ground voltage.

In this illustrated embodiment, the level of the end level Vx(tN) is higher than the initial level Vx(t0). However, the end level Vx(tN) is not restricted to be higher than the level of the initial level Vx(t0). In another example, the end level is lower than the initial level. Thus, in the integrating period TP_IT1, the capacitance evaluation circuit 10 lowers the integrated voltage Vx from its initial level to the end level by accumulating the difference voltage ΔV1 substantially smaller than 0. In the integrating period TP_IT2, the capacitance evaluation circuit 10 increases the integrated voltage Vx from its end level to its initial level by accumulating the difference voltage ΔV2 substantially greater than 0.

Figure 7:
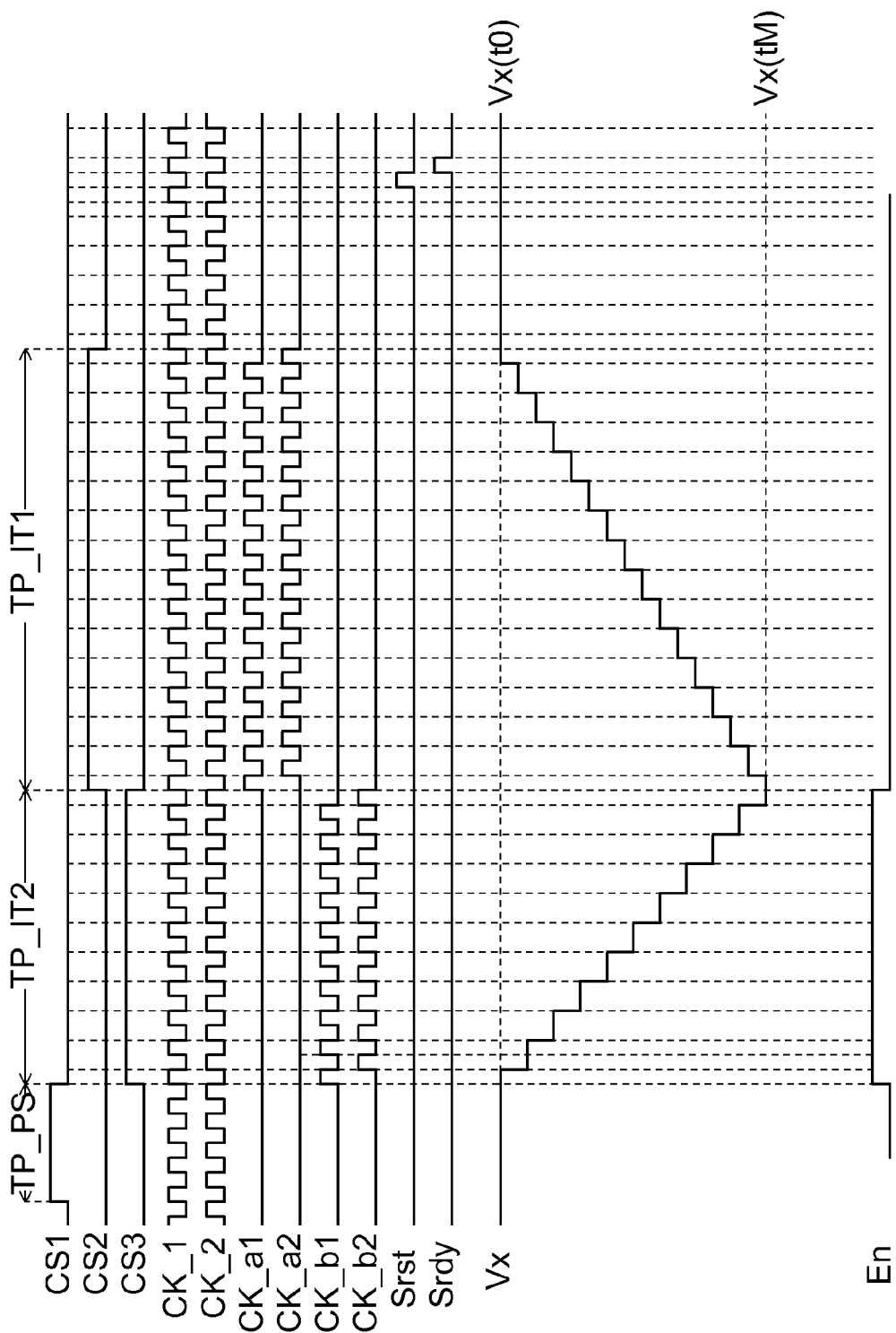
FIG. 7 is a timing chart showing relevant signals of the capacitance evaluation circuit 20 of FIG. 6.

In this embodiment, the control circuits 12 and 14 sequentially control the integrator circuit 16 to perform the integration operation after the voltage setting period TP_PS. However, the capacitance evaluation circuit 10 is not restricted to the condition of sequentially controlling the integrator circuit 16 to operate by the control circuits 12 and 14. In another example, the control circuit 14 may first control the integrator circuit 16 to perform the integration operation, and then the control circuit 12 controls the integrator circuit 16 to perform the integration operation in the capacitance evaluation circuit 10 of this embodiment. In other words, the integrating periods TP_IT2 and TP_IT1 are sequentially entered after the voltage setting period TP_PS. For example, the timing chart of the relevant signals of the capacitance evaluation circuit 10 of FIG. 1 is shown in FIG. 7.

In the capacitance evaluation circuit of this embodiment, the integration operation is performed on the integrated voltage according to the capacitance difference between the to-be-measured capacitor and the capacitance-adjustable circuit. Compared with the prior art, in which the integration operation is directly performed by the to-be-measured capacitor, the equivalent capacitance of the integration capacitor of the capacitance evaluation circuit of this embodiment is smaller. Thus, according to Equation (3), it is obtained that the capacitance evaluation circuit of this embodiment advantageously has the smaller difference voltage ΔV1, and has the advantage that the integrated voltage cannot be easily integrated to the highest voltage in the first integrating period to cause the measurement error when the integration capacitor, the to-be-measured capacitor and the highest voltage are kept unchanged.

In addition, the prior art uses the integration capacitor with the larger capacitance to reduce the size of the difference voltage ΔV1. In general, the integration capacitor of the conventional capacitance evaluation circuit cannot be integrated in the integrated circuit (IC). Because the equivalent capacitance of the integration capacitor of the capacitance evaluation circuit of this embodiment is smaller, the capacitance evaluation circuit of this embodiment can use the integration capacitor with the smaller capacitance when the difference voltage ΔV1 and the highest voltage are kept unchanged. Consequently, the capacitance evaluation circuit of this embodiment further has the advantages of integrating the integration capacitor into the integrated circuit and saving the circuit cost.

In addition, the equivalent capacitance of the capacitance-adjustable circuit is substantially equal to the capacitance of the to-be-measured capacitor. So, when the capacitance of the to-be-measured capacitor is kept unchanged, the difference between the to-be-measured capacitor and the capacitance-adjustable circuit approaches 0. Thus, according to Equation (3), it is obtained that the difference voltage ΔV1 is still held at 0 even if the highest voltage is changed due to the circuit noise when the capacitance of the to-be-measured capacitor is kept unchanged. Thus, the capacitance evaluation circuit of this embodiment further advantageously has the higher noise margin and can advantageously perform the measurement on the variation of the to-be-measured capacitor.

Furthermore, because the capacitance evaluation circuit of this embodiment has the smaller difference voltage ΔV1, the value N of the capacitance evaluation circuit of this embodiment may be designed to be higher when the integration capacitor and the highest voltage are kept unchanged. In this case, it is still assured that the integrated voltage cannot be integrated to the highest voltage in the first integrating period.

According to Equation (7), it is obtained that the capacitance measurement resolution of the capacitance evaluation circuit is correspondingly increased with the increase of the value N. Thus, the capacitance evaluation circuit of this embodiment further has the advantage of the higher capacitance measurement resolution.

Second Embodiment

Figure 8A:
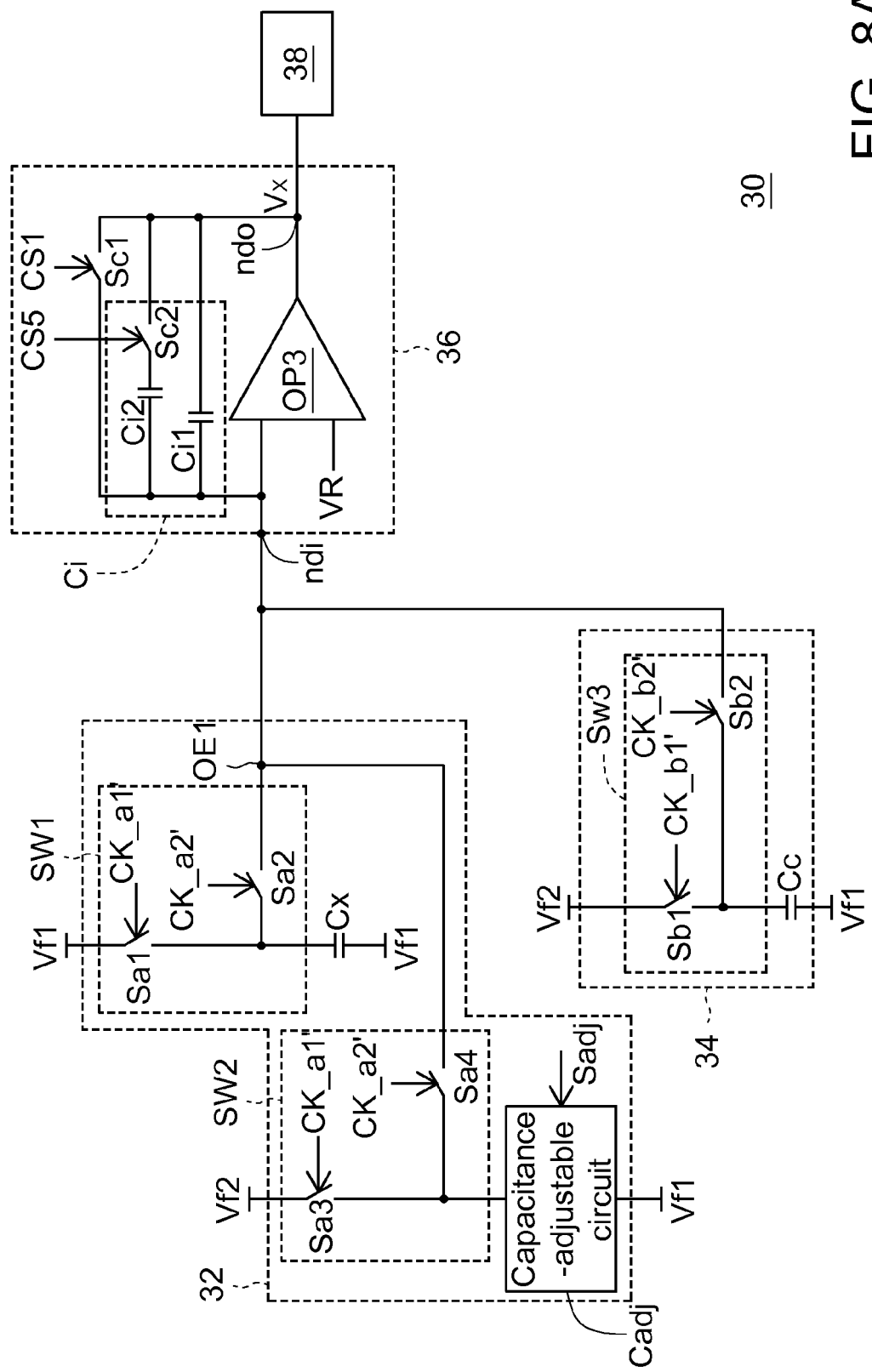
FIGS. 8A and 8B are partially detailed block diagrams showing a capacitance evaluation circuit according to a second embodiment of the invention.
Figure 8B:
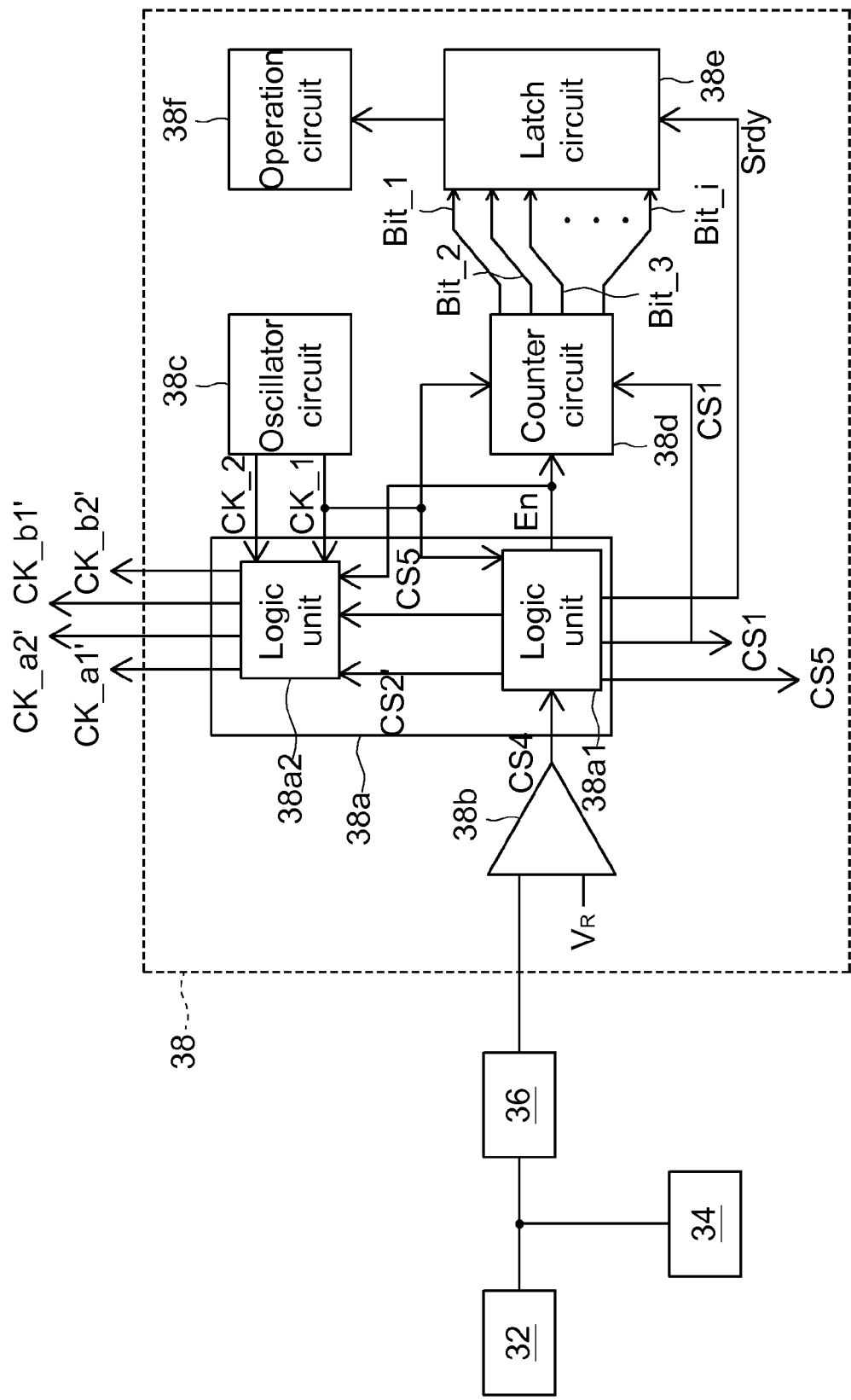
Figure 9:
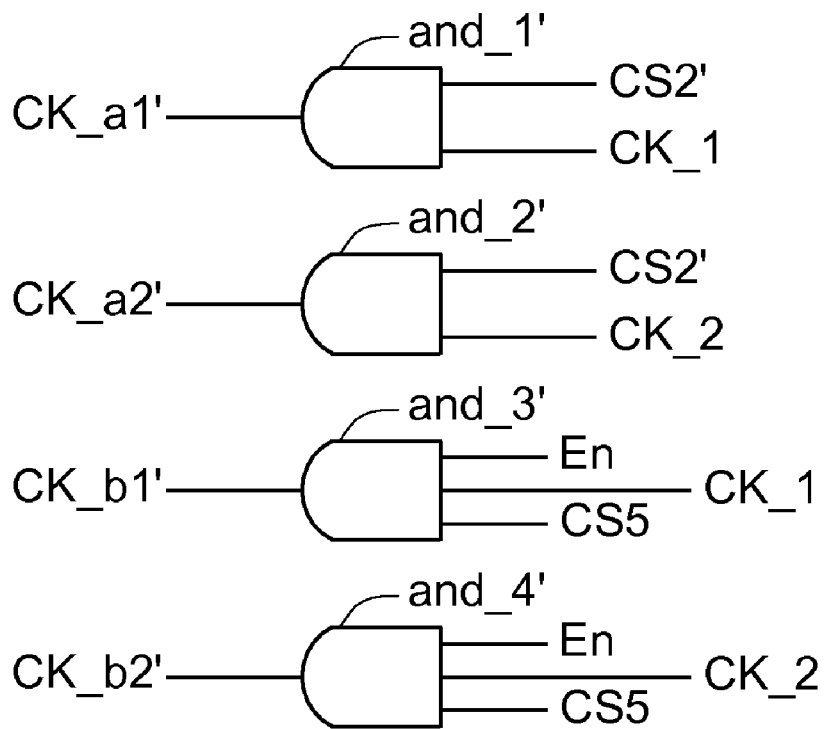
FIG. 9 is a detailed block diagram showing the logic unit 38a2 of FIG. 8B.

The capacitance evaluation circuit of this embodiment performs the Sigma-delta algorithm calculation to obtain the capacitance variation of the to-be-measured capacitor. FIGS. 8A and 8B are partially detailed block diagrams showing a capacitance evaluation circuit 30 according to the second embodiment of the invention. FIG. 9 is a detailed block diagram showing a logic unit 38a2 of FIG. 8B. Referring to FIGS. 8A, 8B and 9, the capacitance evaluation circuit 30 of this embodiment and the capacitance evaluation circuit 10 of the first embodiment have the similar structures, and the difference therebetween is that a logic gate and_3' performs a logic AND operation to generate a clock signal CK_b1' according to the driving signal En, the clock signal CK_1 and the control signal CS5, and a logic gate and_4' performs the logic AND operation to generate a clock signal CK_b2' according to the driving signal En, the clock signal CK_2 and the control signal CS5. In addition, a logic unit 38a1 provides the control signal CS1 as a reset signal for a counter circuit 38d.

Figure 10:
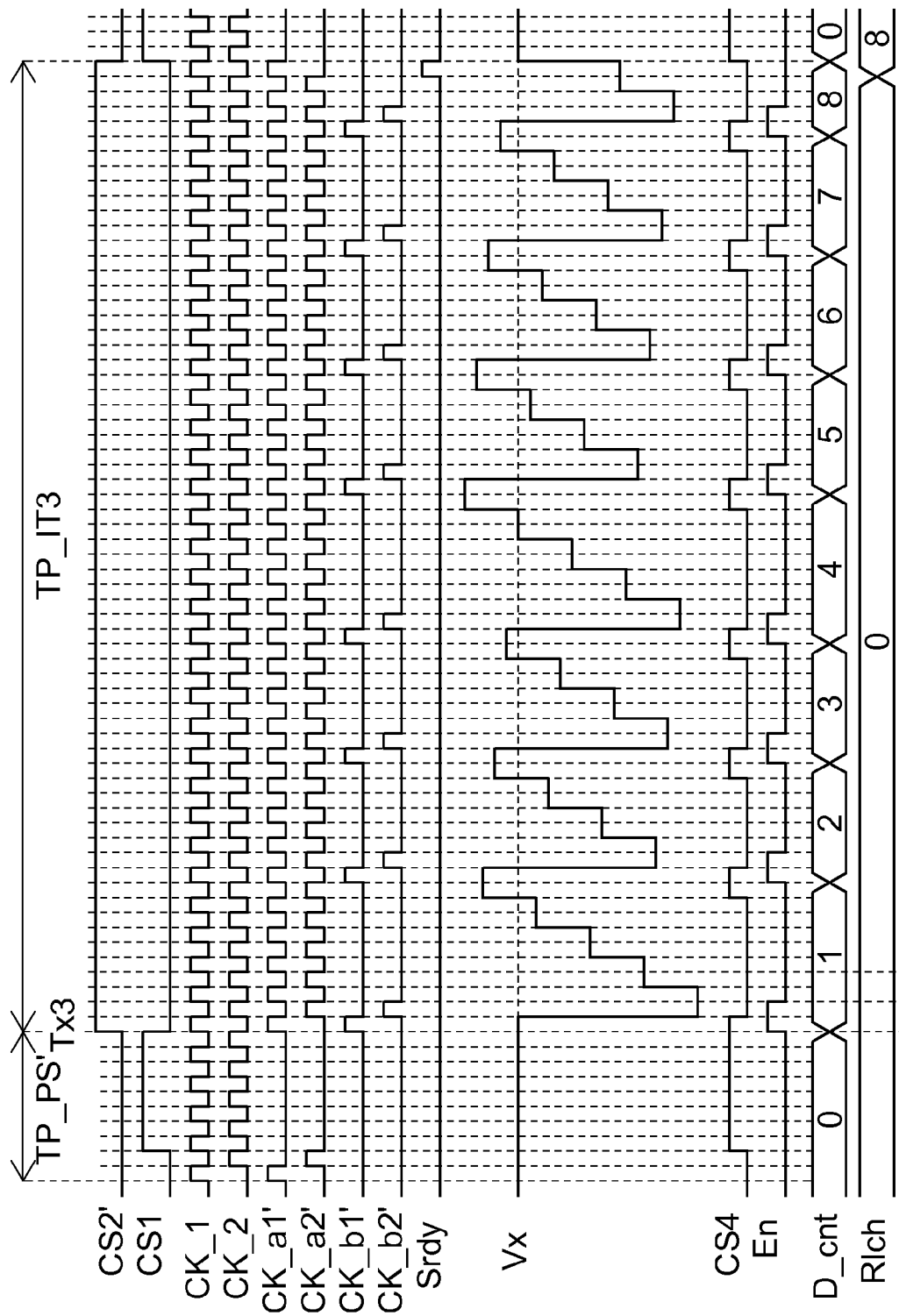
FIG. 10 is a timing chart showing relevant signals of the capacitance evaluation circuit 30 of FIGS. 8A and 8B.

FIG. 10 is a timing chart showing relevant signals of the capacitance evaluation circuit 30 of FIGS. 8A and 8B. Referring to FIG. 10, the capacitance evaluation circuit 30 of this embodiment includes, for example, a voltage setting period TP_PS' and an integrating period TP_IT3, wherein the time lengths of the voltage setting period TP_PS' and the integrating period TP_IT3 are determined by a processor circuit 38. For example, the integrating period TP_IT3 includes X cycles of the clock signal CK_a1', wherein X is a natural number greater than 1. In one example, the control signal CS5 is enabled in the voltage setting period TP_PS' and the integrating period TP_IT3 such that the capacitance of the integration capacitor Ci is substantially equal to the sum of the capacitances of the capacitors Ci1 and Ci2.

The operation performed by the capacitance evaluation circuit 30 in the voltage setting period TP_PS' is similar to that performed by the capacitance evaluation circuit 10 of the first embodiment in the voltage setting period TP_PS, and the processor circuit 38 provides the enabled control signal CS1 to set the voltages of the positive and negative input terminals of an operational amplifier OP3 and the integrated voltage Vx to be the reference voltage VR. Different from the capacitance evaluation circuit 10 of the first embodiment, the counter circuit 38d resets the count data D_cnt to be the value 0 in response to the enabled control signal CS1. In addition, when the integrated voltage Vx is higher than or equal to the reference voltage VR, a comparator circuit 38b of this embodiment generates the enabled control signal CS4. When the integrated voltage Vx is lower than the reference voltage VR, the comparator circuit 38b generates the disabled control signal CS4.

In the integrating period TP_IT3, the logic unit 38a1 continuously provides an enabled control signal CS2' to drive the logic unit 38a2 to continuously generate the clock signals CK_a1' and CK_a2'. In addition, the logic unit 38a1 further provides the enabled driving signal En in response to the enabled control signal CS4. For example, the driving signal En is enabled in an operating sub-period TP1'. Thus, the logic unit 38a2 generates the clock signals CK_b1' and CK_b2' in response to the enabled driving signal, and control circuits 32 and 34 simultaneously perform the integration operations on the integrated voltage Vx. If the reference voltage VR is equal to the average voltage of the voltage Vf1 and the voltage Vf2, the operation satisfies Equations (13) and (14):

$$Cx \times (Vf1 - Vf1) + Cadj \times (Vf2 - Vf1) + \\ Cc \times (Vf2 - Vf1) + Ci \times (VR - VR) = Cx \times (VR - Vf1) + \\ Cadj \times (VR - Vf1) + Cc \times (VR - Vf1) + Ci \times (VR - Vx(t1)) \quad (13)$$

$$Vx(t1) = Vx(t0) + \Delta V(-) \\ = VR + \frac{(Vf2 - Vf1) \times (Cx - Cadj - Cc)}{2Ci} \quad (14)$$

In addition, the counter circuit 38d adds 1 to the count data D_cnt (from the value 0 to the value 1) in response to the enabled driving signal En.

After the operating sub-period TP1', the integrated voltage Vx is lowered to the level Vx(t1) and is substantially lower than the reference voltage VR. Thus, the control signal CS4 and the driving signal En are disabled, and the clock signals CK_b1' and CK_b2' are disabled. Consequently, in an operating sub-period TP2' after the operating sub-period TP1', the control circuit 32 performs the integration operation on the integrated voltage Vx. At this time, the operation satisfies Equations (15) and (16):

$$Cx \times (Vf1 - Vf1) + Cadj \times (Vf2 - Vf1) + Ci \times (VR - Vx(t1)) = \\ Cx \times (VR - Vf1) + Cadj \times (VR - Vf1) + Ci \times (VR - Vx(t2)) \quad (15)$$

$$Vx(t2) = Vx(t1) + \Delta V(+) \\ = [VR + \Delta V(-)] + \frac{(Vf2 - Vf1) \times (Cx - Cadj)}{2Ci} \quad (16)$$

Because the level Vx(t2) of the integrated voltage Vx is still lower than the reference voltage VR, the control circuit 32 continuously performs the integration operation on the integrated voltage Vx in an operating sub-period TP3' after the operating sub-period TP2'. At this time, the operational description can be derived according to Equations (15) and (16).

In summary, the logic unit 38a1 correspondingly drives the capacitance evaluation circuit 30 to lower the integrated voltage Vx by a reverse voltage difference value $\Delta V(-)$, or to increase the integrated voltage Vx by a forward voltage difference value $\Delta V(+)$ by judging whether the driving signal En is enabled. The value of the count data D_cnt is equal to, for example, the number of operation times that the capacitance evaluation circuit 30 performs the operation of lowering the integrated voltage Vx by one reverse voltage difference value $\Delta V(-)$.

When the integrating period TP_IT3 ends, the count data D_cnt is equal to, for example, a value Y, wherein Y is a natural number. In other words, the capacitance evaluation circuit 30 performs, Y times, the operation of lowering the integrated voltage Vx by one reverse voltage difference value $\Delta V(-)$ and performs, (X−Y) times, the operation of increasing the integrated voltage Vx by one forward voltage difference value $\Delta V(+)$ in the integrating period TP_IT3. Thus, the level Vx(tX) of the integrated voltage Vx when the integrating period TP_IT3 ends satisfies the following equation:

$$Vx(tX) = Vx(t0) + Y \times \Delta V(-) + (X - Y) \times \Delta V(+) \quad (17)$$

The assumed condition is:

$$Vx(tX) = Vx(t0) + \Delta V_{ERR} \quad (18)$$

Equation (17) may be rewritten as:

$$Vx(t0) + \Delta V_{ERR} = Vx(t0) + \qquad (19)$$
$$Y \times \frac{(Vf2 - Vf1) \times (-Cc)}{Ci} + X \times \frac{(Vf2 - Vf1) \times (Cx - Cadj)}{Ci}$$
$$\Rightarrow Cx - Cadj = Cc \times \frac{Y}{X} + \frac{Ci \times \Delta V_{ERR}}{X \times (Vf2 - Vf1)}$$

Assume the condition is satisfied:

$$X \times (Vf2 - Vf1) \gg Ci \times \Delta V_{ERR} \qquad (20)$$

Equation (19) may be rewritten as:

$$Cx - Cadj = Cc \times \frac{Y}{X} \qquad (21)$$

Thus, the processor circuit 38 of this embodiment may obtain the variation of the to-be-measured capacitor Cx according to the values Y and X and the capacitance of the known capacitor Cc. In this embodiment, the value Y is equal to 8, for example.

Figure 11A:
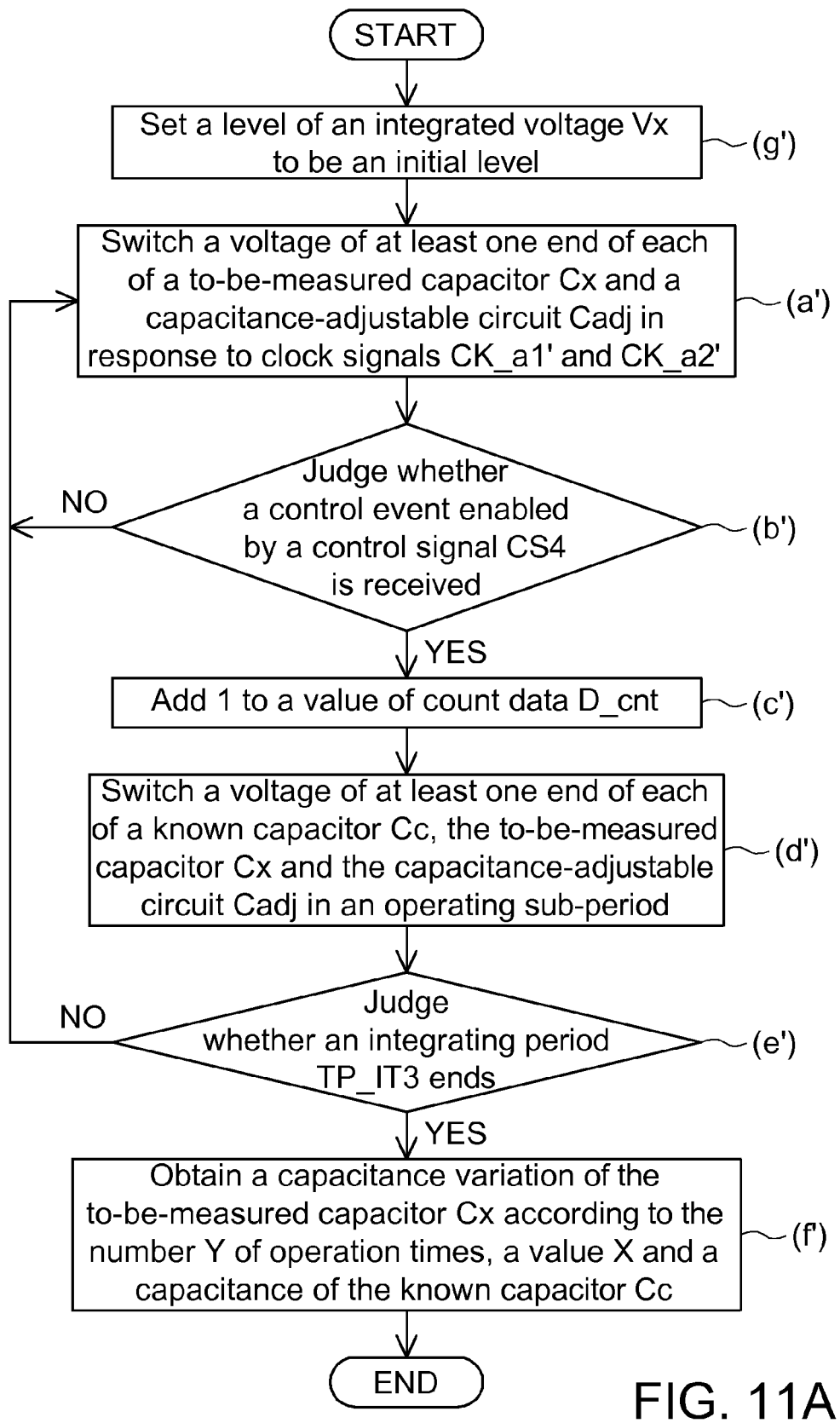
FIGS. 11A to 11C are flow charts showing a capacitance evaluation method according to the second embodiment of the invention.
Figure 11B:
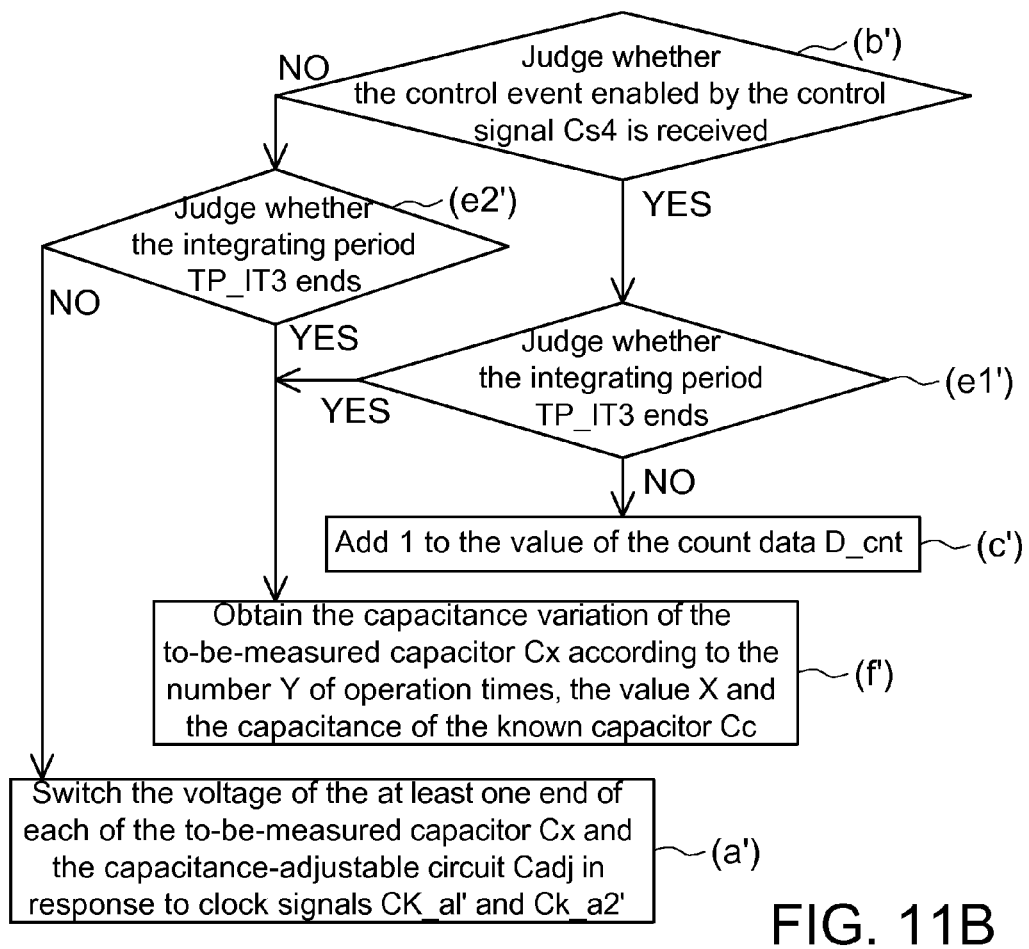
Figure 11C:
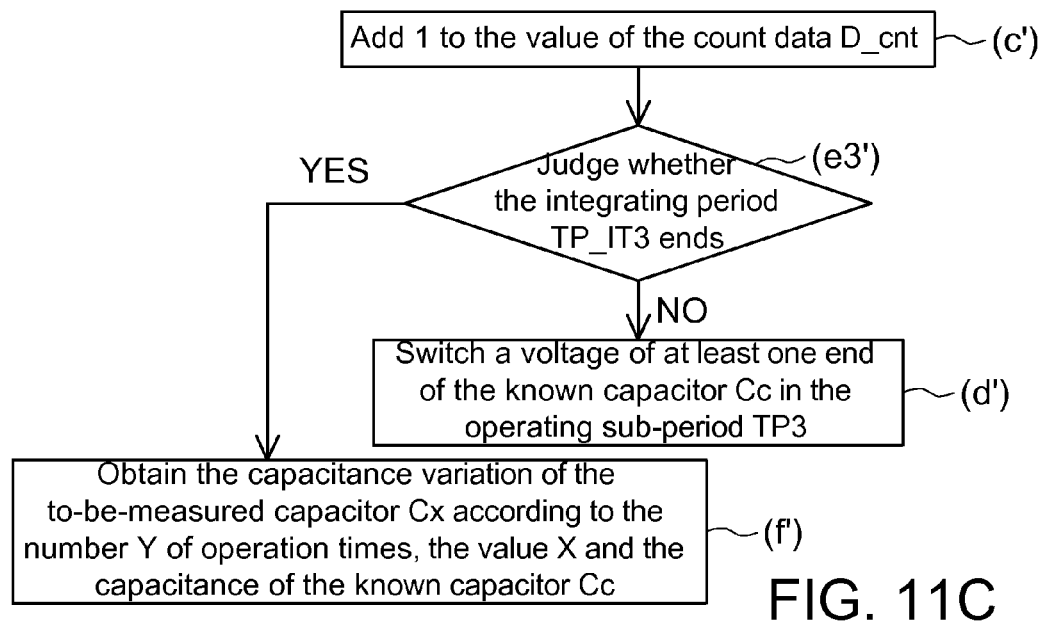

FIGS. 11A to 11C are flow charts showing a capacitance evaluation method according to the second embodiment of the invention. First, as shown in step (a'), the control circuit 32 switches the voltages of at least one end of the to-be-measured capacitor Cx and at least one end of the capacitance-adjustable circuit Cadj in response to the clock signals CK_a1' and CK_a2' to adjust the integrated voltage Vx to be a sum of the present level of the integrated voltage Vx and the difference voltage ΔV(+), which is relevant to the difference between the capacitance of the to-be-measured capacitor Cx and the equivalent capacitance of the capacitance-adjustable circuit Cadj.

Next, as shown in step (b'), the processor circuit 38 judges whether the control event enabled by the control signal CS4 is received. If not, the step (a') is repeated. If yes, step (c') is performed. When the control event enabled by the control signal CS4 is received, the step (c') is performed, and the counter circuit 38d adds 1 to the value of the count data D_cnt. Next, as shown in step (d'), the processor circuit 38 provides a clock signal to switch the voltages of the at least one ends of the known capacitor Cc, the to-be-measured capacitor Cx and the capacitance-adjustable circuit Cadj in an operating sub-period to adjust the integrated voltage Vx to be a sum of the present level of the integrated voltage Vx and the difference voltage ΔV(−), which is relevant to the capacitances of the known capacitor Cc, the to-be-measured capacitor Cx and the capacitance-adjustable circuit Cadj.

Next, as shown in step (e'), the processor circuit 38 judges whether the integrating period TP_IT3 ends. If not, the step (a') is repeated. If yes, step (f') is performed. When the integrating period TP_IT3 ends, the step (f') is performed, and the processor circuit 38 obtains the number of operation times that the control circuit 34 performs the step (c') in the integrating period TP_IT3 according to the value Y of the count data D_cnt, and obtains the capacitance variation of the to-be-measured capacitor Cx according to the number Y of operation times, the value X, the equivalent capacitance of the capacitance-adjustable circuit Cadj and the capacitance of the known capacitor Cc.

In one example, as shown in FIG. 11B, when the processor circuit 38 judges that the control event enabled by the control signal CS4 is received in the step (b'), the step (e1') is performed, and the processor circuit 38 judges whether the integrating period TP_IT3 ends. If not, the step (c') is performed. If yes, the step (f') is performed. When the processor circuit 38 judges that no control event enabled by the control signal CS4 is received in the step (b'), the step (e2') is performed, and the processor circuit 38 judges whether the integrating period TP_IT3 ends, If not, the step (a') is performed. If yes, the step (f') is performed.

In one example, as shown in FIG. 11C, the method further includes, between the steps (c') and (d'), the step (e3'), in which the processor circuit 38 judges whether the integrating period TP_IT3 ends. If not, the step (d') is performed. If yes, the step (f') is performed.

Similar to the first embodiment, the capacitance evaluation method of this embodiment further includes, before the step (a'), the step (g') of setting the level of the integrated voltage Vx to be the initial voltage VR.

Figure 12:
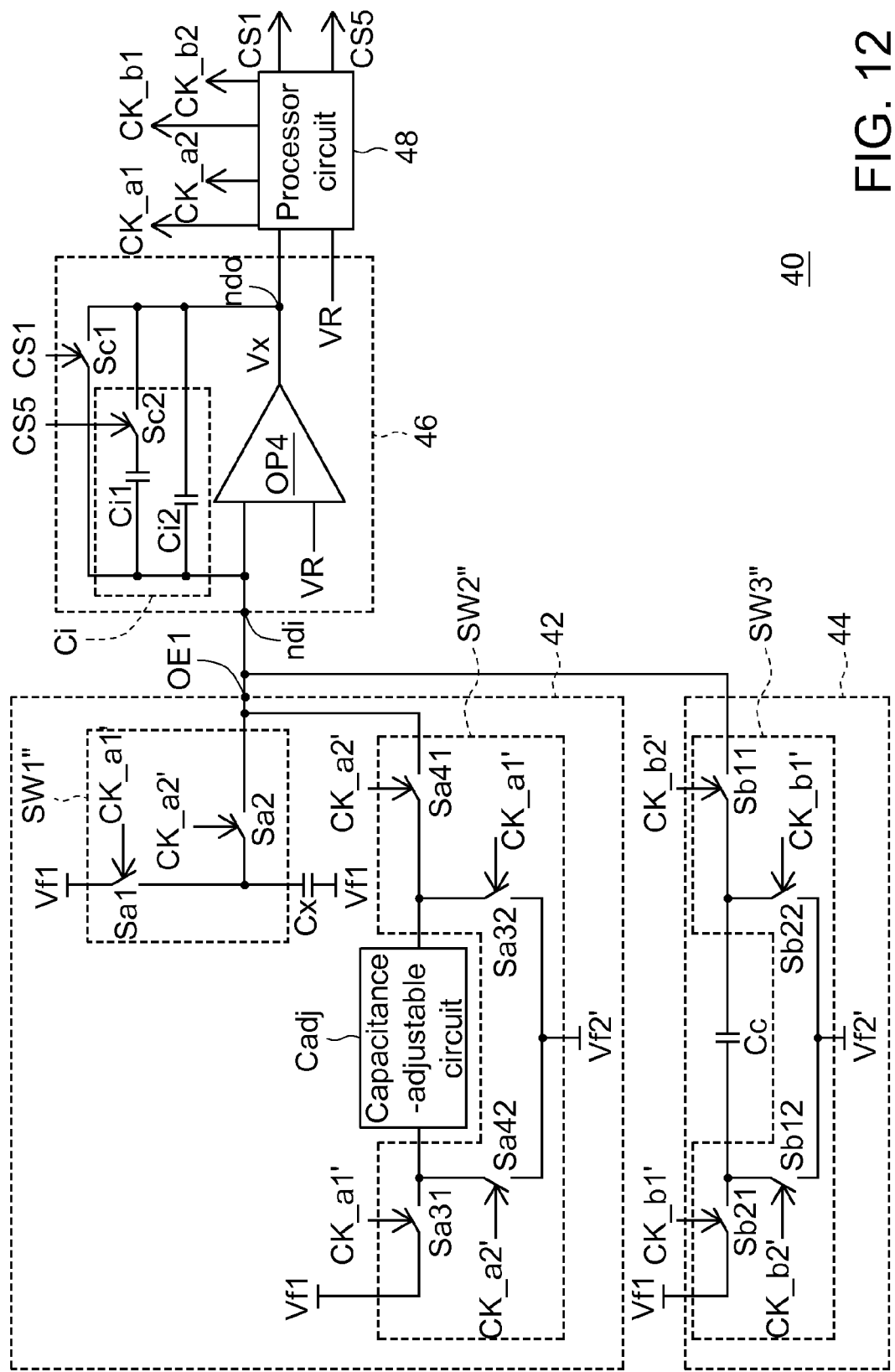
FIG. 12 is another block diagram showing the capacitance evaluation circuit according to the second embodiment of the invention.

In one example of this illustrated embodiment, the capacitance evaluation circuit 30 only has the circuit structures of FIGS. 8A and 8B. However, the capacitance evaluation circuit 30 of this embodiment is not restricted thereto. In another example, the capacitance evaluation circuit 30 may have the structure shown in FIG. 12. In the example of FIG. 12, only one end of the to-be-measured capacitor Cx receives the voltage Vf1. However, the one end of the to-be-measured capacitor Cx is not restricted to have the function of receiving the voltage Vf1, but may further have the function of receiving any voltage ranging between the highest voltage VDD and the ground voltage.

Similar to the first embodiment, the capacitance evaluation circuit of this embodiment may also perform the integration operation on the integrated voltage according to the difference between the to-be-measured capacitor and the capacitance-adjustable circuit. Thus, the capacitance evaluation circuit of this embodiment also advantageously has the smaller difference voltage ΔV(+), so that the integration capacitor can be integrated into the integrated circuit, the circuit cost is lower, the noise margin is higher and the variation of the to-be-measured capacitor can be precisely measured.

In addition, the capacitance evaluation circuit of this embodiment performs the integration on the integrated voltage through the Sigma-delta algorithm. Consequently, compared with the capacitance evaluation circuit of the first embodiment, the capacitance evaluation circuit of this embodiment further has the advantages of the wider range of the designed value N and the higher capacitance measurement resolution.

Figure 13:
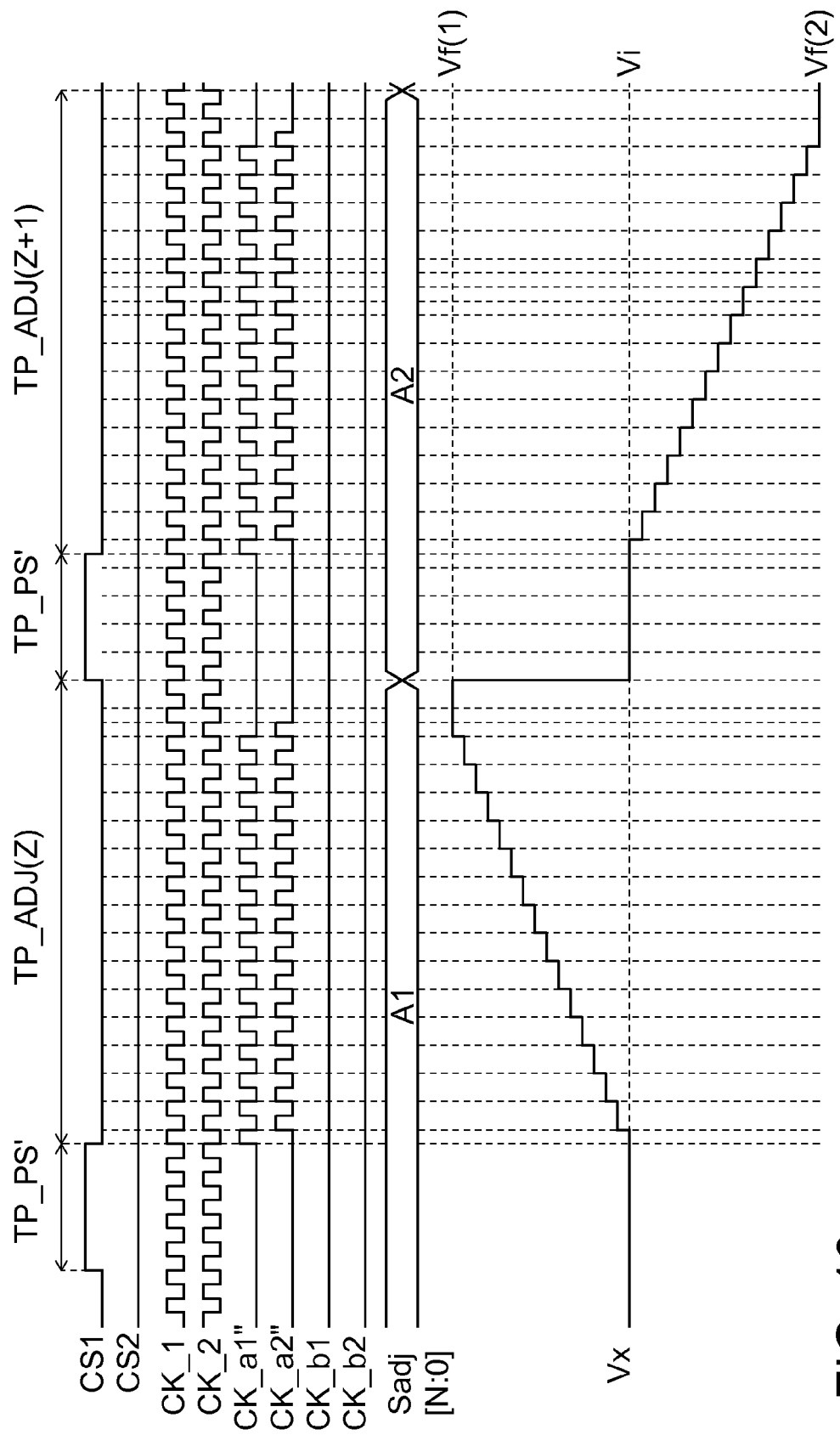
FIG. 13 is a timing chart showing relevant signals used when the capacitance evaluation circuit performs a capacitance setting operation according to the embodiment of the invention.

In the first and second embodiments of the invention, the capacitance evaluation circuits 10 to 40 further perform the capacitance setting operation, for example, to make the capacitance of the capacitance-adjustable circuit Cadj approach the capacitance of the to-be-measured capacitor Cx. For example, FIG. 13 is a timing chart showing relevant signals used when the capacitance evaluation circuit performs the capacitance setting operation according to the embodiment of the invention.

The processor circuit sets the capacitance of the capacitance-adjustable circuit Cadj to be a minimum, and then integrates the integrated voltage Vx according to the to-be-measured capacitor Cx and the capacitance-adjustable circuit Cadj in the capacitance setting period TP-ADJ(j), wherein j is a natural number. The processor circuit further judges the levels of the integrated voltage Vx and the initial voltage Vi after the capacitance setting period TP_ADJ(j) ends.

For example, when the capacitance setting period TP-ADJ (Z) ends, the processor circuit judges that the integrated voltage Vx is higher than the initial voltage Vi, wherein Z is a natural number. At this time, it represents that the capacitance of the capacitance-adjustable circuit Cadj is smaller than the capacitance of the to-be-measured capacitor Cx. Thus, the processor circuit adjusts the setting signal Sadj to increase the capacitance of the capacitance-adjustable circuit Cadj. The above-mentioned operation is repeated until the processor has detected the critical condition when the integrated voltage Vx is lower than the initial voltage Vi (e.g., when the voltage setting period TP_ADJ(Z+1) ends), and the operation is thus terminated. At this time, the capacitance of the capacitance-adjustable circuit Cadj approaches the capacitance of the to-be-measured capacitor Cx.

In the capacitance setting period TP_ADJ(j) and the voltage setting period TP_PS', the processor circuit further outputs the disabled control signal CS5 to disable the switch Sc2 of the integration capacitor Ci so that the capacitance of the integration capacitor Ci is equal to the capacitance of the capacitor Ci1, but is not equal to the sum of the capacitances of the capacitors Ci1 and Ci2. According to Equations (3) and (5), it is obtained that the integration capacitor Ci negatively relates to the levels of the difference voltages $\Delta V1$ and $\Delta V2$. Thus, reducing the equivalent capacitance of the integration capacitor Ci by the disabled switch Sc2 can enhance the voltage difference between the voltages in the capacitance setting period TP_ADJ(j) and the integration operation so that the capacitance evaluation circuit can distinguish between the relationships of the integrated voltage Vx and the initial voltage Vi more easily.

Figure 14:
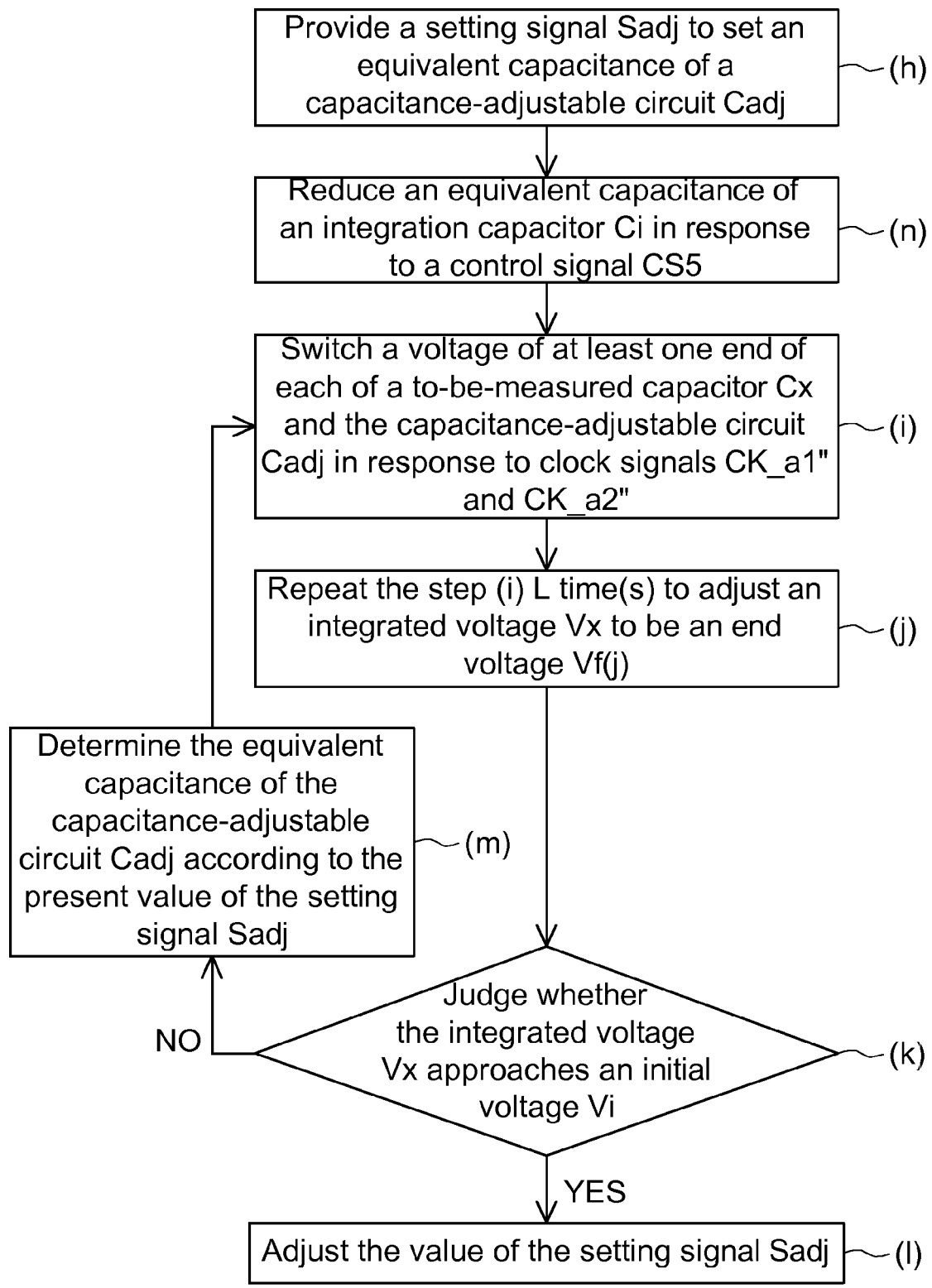
FIG. 14 is a flow chart showing a capacitance setting method according to the embodiment of the invention.

FIG. 14 is a flow chart showing a capacitance setting method according to the embodiment of the invention. The capacitance setting method is performed before, for example, the steps (a) and (a') of the capacitance evaluation method according to the first and second embodiments of the invention. The capacitance setting method of this embodiment includes the following steps, for example. First, as shown in step (h), the processor circuit provides the setting signal Sadj to set the capacitance-adjustable circuit Cadj to have the minimum capacitance. Next, as shown in step (i), the control circuit switches the voltages of the at least one ends of the to-be-measured capacitor Cx and the capacitance-adjustable circuit Cadj in response to the clock signals CK_a1" and CK_a2" to adjust the integrated voltage Cx to be the sum of the present integrated voltage Vx and the difference voltage $\Delta V(+)$.

Then, as shown in step (j), the step (i) is repeated L times in the voltage setting period TP_ADJ(j) to adjust the integrated voltage Vx to be the end voltage Vf(j). Next, as shown in step (k), the processor circuit judges whether the end voltage Vf(j) satisfies the critical condition that the end voltage Vf(j) is lower than the initial voltage Vi. If not, the step (m) is performed. If yes, the step (I) is performed.

As shown in step (m), the processor circuit adjusts the value of the setting signal Sadj so that the capacitance of the capacitance-adjustable circuit Cadj may be increased by a minimum adjustable capacitance, and the step (i) is repeated. As shown in step (I), the processor circuit determines the equivalent capacitance of the capacitance-adjustable circuit Cadj according to the present value of the setting signal Sadj. After the step (I), the step (g') of FIG. 11A or the step (f) of FIG. 5 is performed.

The method further includes, between the steps (h) and (i), the step (n), in which the processor circuit provides the disabled control signal CS5 to turn off the switch Sc2 of the integration capacitor Ci in the capacitance setting period TP_ADJ(j) and the voltage setting period TP_PS' so that the equivalent capacitance of the integration capacitor Ci is reduced.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A capacitance evaluation circuit, comprising:
   an integrator circuit having a first input terminal and a first output terminal, which has an integrated voltage, wherein the integrator circuit is for setting the integrated voltage to be an initial level in response to an enable level of a first control signal;
   a first control circuit comprising a second output terminal, a to-be-measured capacitor and a capacitance-adjustable circuit, wherein the second output terminal is electrically connected to the first input terminal, the capacitance-adjustable circuit determines an equivalent capacitance approaching a capacitance of the to-be-measured capacitor in response to a signal value of a setting signal, the first control circuit switches voltage levels of at least one end of the to-be-measured capacitor and at least one end of the capacitance-adjustable circuit in response to a first set of clock signals, and thus performs a first adjusting operation to adjust the integrated voltage to be a sum of a present level of the integrated voltage and a first difference voltage, and the first difference voltage is relevant to a difference between the capacitance of the to-be-measured capacitor and the equivalent capacitance;
   a second control circuit comprising a third output terminal and a known capacitor, wherein the third output terminal is electrically connected to the first input terminal, the second control circuit is for switching a voltage level of at least one end of the known capacitor in response to a second set of clock signals to perform a second adjusting operation to adjust the integrated voltage to be a sum of the present level of the integrated voltage and a second difference voltage; and
   a processor circuit for providing the first and second sets of clock signals to drive the first and second control circuits to perform the first and second adjusting operations, respectively, for calculating the number of operation times that the second control circuit performs the second adjusting operation in a first integrating period, and for obtaining the capacitance of the to-be-measured capacitor according to the number of operation times and a capacitance of the known capacitor.

2. The evaluation circuit according to claim 1, wherein the first control circuit further comprises:
   a first switch circuit for providing a first voltage to a first end of the to-be-measured capacitor in response to an enable level of a first forward clock signal of the first set of clock signals, and coupling the first end of the to-be-measured capacitor to the integrator circuit in response to an enable level of a first reverse clock signal of the first set of clock signals,
   wherein the first forward clock signal is an inverse of the first reverse clock signal.

3. The evaluation circuit according to claim 2, wherein the first control circuit further comprises:
   a second switch circuit for providing a second voltage to a first end of the capacitance-adjustable circuit in response to the enable level of the first forward clock signal, and coupling the first end of the capacitance-adjustable circuit to the integrator circuit in response to the enable level of the first reverse clock signal, wherein a second end of the to-be-measured capacitor and a second end of the capacitance-adjustable circuit receive a third voltage.

4. The evaluation circuit according to claim 2, wherein the first control circuit further comprises:

a second switch circuit for making a first end and a second end of the capacitance-adjustable circuit respectively receive a second voltage and the first voltage in response to the enable level of the first forward clock signal, and making the first end and the second end of the capacitance-adjustable circuit be coupled to the integrator circuit and receive the second voltage, respectively, in response to the enable level of the first reverse clock signal.

5. The evaluation circuit according to claim 1, wherein the integrator circuit comprises:

an operational amplifier having a positive input terminal, a negative input terminal and an output terminal, wherein the positive input terminal of the operational amplifier receives a fourth voltage, the negative input terminal of the operational amplifier is coupled to the first and second control circuits, and the output terminal of the operational amplifier is coupled to the processor circuit;

a first integration capacitor having two ends respectively coupled to the negative input terminal and the output terminal of the operational amplifier; and a fourth switch circuit having a first end and a second end respectively coupled to the negative input terminal and the output terminal of the operational amplifier, wherein the fourth switch circuit is turned on in response to the enable level of the first control signal to electrically connect the negative input terminal of the operational amplifier to the output terminal of the operational amplifier in a short-circuited manner, and sets voltages of the negative input terminal and the output terminal of the operational amplifier to be the fourth voltage.

6. The evaluation circuit according to claim 5, wherein the integrator circuit further comprises a second integration capacitor and a fifth switch circuit, the second integration capacitor and the fifth switch circuit are serially connected to the negative input terminal and the output terminal of the operational amplifier, the fifth switch circuit is turned on in response to an enable level of a second control signal so that the first and second integration capacitors are connected in parallel.

7. The evaluation circuit according to claim 1, wherein the processor circuit comprises:

a comparator circuit for comparing a level of the integrated voltage with a level of a fourth voltage to output a third control signal;

a first logic circuit for judging whether the third control signal satisfies a triggering condition in the first integrating period, and triggering a control event when the third control signal satisfies the triggering condition;

a second logic circuit for generating the first set of clock signals to drive the first control circuit in the first integrating period, and generating the second set of clock signals to drive the second control circuit in response to the control event;

a counter circuit for adding 1 to a count value in response to the control event in the first integrating period, wherein the counter circuit treats the count value as the number of operation times for output after the first integrating period; and a latch circuit for recording the number of operation times in response to an enable level of a latch control signal.

\* \* \* \* \*